(12) United States Patent
Baek et al.

(10) Patent No.: US 10,332,843 B2
(45) Date of Patent: Jun. 25, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Yong Ho Baek, Suwon-si (KR); Moon Hee Yi, Suwon-si (KR); Kyung Sang Lim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/667,315

(22) Filed: Aug. 2, 2017

(65) Prior Publication Data
US 2018/0053732 A1 Feb. 22, 2018

(30) Foreign Application Priority Data

Aug. 19, 2016 (KR) .................. 10-2016-0105511
Oct. 21, 2016 (KR) .................. 10-2016-0137656

(51) Int. Cl.
*H01L 23/13* (2006.01)
*H01L 23/552* (2006.01)
(Continued)

(52) U.S. Cl.
CPC ............ *H01L 23/552* (2013.01); *H01L 23/13* (2013.01); *H01L 23/5389* (2013.01); *H01L 24/20* (2013.01); *H01L 25/105* (2013.01); *H01L 23/3128* (2013.01); *H01L 23/49811* (2013.01); *H01L 23/5386* (2013.01); *H01L 25/0655* (2013.01); *H01L 2224/0401* (2013.01); *H01L 2224/04105* (2013.01); *H01L 2224/12105* (2013.01); *H01L 2224/16227* (2013.01); *H01L 2224/32225* (2013.01); *H01L 2224/48227* (2013.01); *H01L 2224/73204* (2013.01);
(Continued)

(58) Field of Classification Search
CPC ..................................................... H05K 1/0216
See application file for complete search history.

(56) References Cited

U.S. PATENT DOCUMENTS 9,368,455 B2    6/2016  Mahajan et al.
2009/0284947 A1 11/2009 Beddingfield et al.
(Continued)

FOREIGN PATENT DOCUMENTS

JP     2012-015239 A    1/2012
KR     10-2016-0037805 A  4/2016
KR     10-2016-0048277 A  5/2016

OTHER PUBLICATIONS

Office Action issued in Taiwanese Patent Appliucation No. 106126331, dated Apr. 27, 2018 (English translation).
(Continued)

*Primary Examiner* — Fernando L Toledo
*Assistant Examiner* — Valerie N Newton
(74) *Attorney, Agent, or Firm* — Morgan Lewis & Bockius LLP

(57) ABSTRACT

A fan-out semiconductor package includes a semiconductor chip disposed in a through-hole of a first connection member having the through-hole and a second connection member disposed on an active surface of the semiconductor chip. A plurality of dummy vias surrounding the semiconductor chip are disposed in the first connection member.

20 Claims, 20 Drawing Sheets

(51) Int. Cl.
    *H01L 23/00*     (2006.01)
    *H01L 23/538*     (2006.01)
    *H01L 25/10*     (2006.01)
    *H01L 23/31*     (2006.01)
    *H01L 23/498*     (2006.01)
    *H01L 25/065*     (2006.01)

(52) U.S. Cl.
    CPC .............. *H01L 2224/73265* (2013.01); *H01L 2225/107* (2013.01); *H01L 2225/1035* (2013.01); *H01L 2924/1434* (2013.01); *H01L 2924/15311* (2013.01); *H01L 2924/18162* (2013.01); *H01L 2924/3025* (2013.01); *H01L 2924/3511* (2013.01)

(56) References Cited

U.S. PATENT DOCUMENTS

| | | | |
|---|---|---|---|
| 2013/0319731 A1 | 12/2013 | Lee | |
| 2014/0054080 A1* | 2/2014 | Sato | ........................ H05K 1/183 174/266 |
| 2016/0013148 A1 | 1/2016 | Lin et al. | |
| 2016/0093572 A1 | 3/2016 | Chen | |
| 2016/0118337 A1 | 4/2016 | Yoon et al. | |
| 2016/0338202 A1* | 11/2016 | Park | ........................ H01L 23/48 |

OTHER PUBLICATIONS

Korean Office Action dated Dec. 5, 2018 issued in Korean Patent Application No. 10-2016-0137656 (with English translation).

* cited by examiner

I-I'

I-I'

I-I'

II-II'

II-II'

II-II'

FAN-OUT SEMICONDUCTOR PACKAGE

CROSS-REFERENCE TO RELATED APPLICATION(S)

This application claims priority under 35 U.S.C. § 119 to Korean Patent Application Nos. 10-2016-0105511 filed on Aug. 19, 2016, and 10-2016-0137656 filed on Oct. 21, 2016, in the Korean Intellectual Property Office (KIPO), the disclosures of which are incorporated herein by reference in their entirety.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

Recently, a trend in the development of technology related to semiconductor chips has been reductions in the size of semiconductor chips. Therefore, in the area of package technology, due to an increased demand for smaller size semiconductor chips, semiconductor packages are increasingly compact in size, while including an increased number of pins.

One type of package technology suggested to satisfy the technical demand as described above is a fan-out package. Such a fan-out package has a compact size and may allow a plurality of pins to be implemented by redistributing connection terminals outwardly from a region in which a semiconductor chip is disposed.

SUMMARY

An aspect of the present disclosure may provide a fan-out semiconductor package having improved electromagnetic interference (EMI) blocking characteristics.

According to an aspect of the present disclosure, a fan-out semiconductor package may include a connection member having a through-hole having a semiconductor chip disposed therein, and dummy vias that block EMI are formed separate from signal vias present in the connection member.

According to an aspect of the present disclosure, a fan-out semiconductor package may include a first connection member having a through-hole, a semiconductor chip disposed in the through-hole of the first connection member and having an active surface with connection pads disposed thereon and an inactive surface opposite the active surface, an encapsulant encapsulating at least a portion of the first connection member and the inactive surface of the semiconductor chip, and a second connection member disposed on the first connection member and the active surface of the semiconductor chip. The first connection member and the second connection member include, respectively, redistribution layers electrically connected to the connection pads of the semiconductor chip, the redistribution layer of the first connection member includes a signal pattern and a ground pattern, and the first connection member includes a plurality of dummy vias connected to the ground pattern and surrounding the semiconductor chip.

According to another aspect of the present disclosure, a fan-out semiconductor package may include a first connection member having a through-hole, a semiconductor chip disposed in the through-hole of the first connection member and having an active surface with connection pads disposed thereon and an inactive surface opposite the active surface, and a second connection member disposed on the first connection member and the active surface of the semiconductor chip and including a redistribution layer electrically connected to the connection pads of the semiconductor chip. The first connection member includes a plurality of signal vias and a plurality of dummy vias, and the plurality of dummy vias surround the plurality of signal vias or are surrounded by the plurality of signal vias.

BRIEF DESCRIPTION OF DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1:
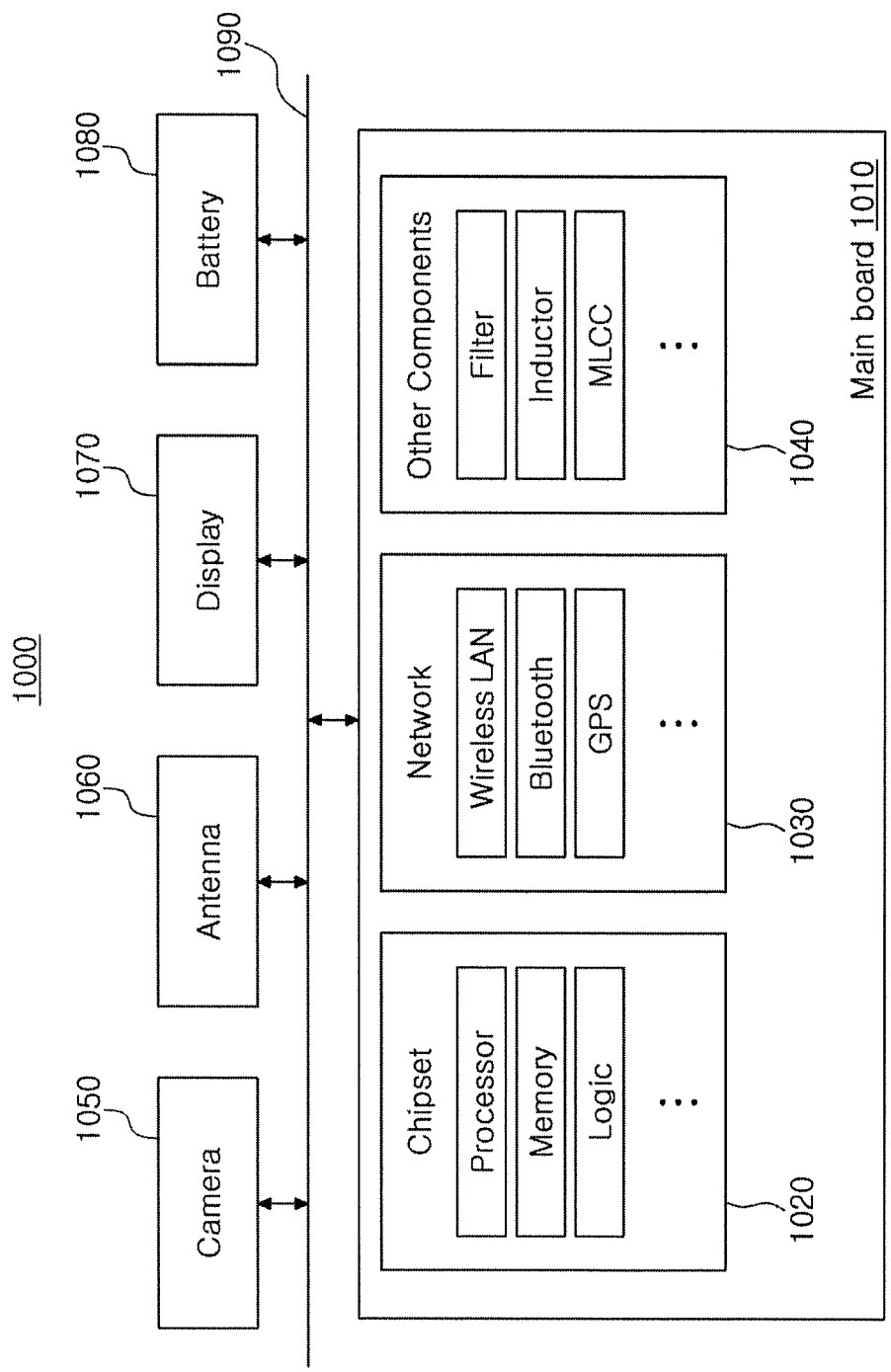
FIG. 1 is a schematic block diagram of an example electronic device system.

Hereinafter, exemplary embodiments in the present disclosure will be described with reference to the accompanying drawings. In the accompanying drawings, shapes, sizes, and the like, of components may be exaggerated or shortened for clarity.

As used herein, "an exemplary embodiment", and any variations thereof, may not refer to the same exemplary embodiment, and is used herein to emphasize a particular feature or characteristic different from another exemplary embodiment disclosed herein. However, exemplary embodiments provided herein may be combined in whole or in part one with one or more other disclosed exemplary embodiments. For example, an element described in an exemplary embodiment, may be included in another exemplary embodiment even if not explicitly described therein, unless an opposite or contradictory description is provided.

As used herein, a "connection" of a first component with a second component, and any variations thereof, include an indirect connection between the first and second components through one or more other components as well as a direct connection between the first and second components. As used herein, "electrically connected" and any variations thereof refer to a physical connection and a physical disconnection. It can be understood that when an element is referred to with "first" and "second", the element is not limited thereby. They may be used only for a purpose of distinguishing the element from each other, and may not limit the sequence or importance of the elements. In some cases, a first element may be referred to as a second element, without departing from the scope of the disclosure. Similarly, a second element may also be referred to as a first element, without departing from the scope of the disclosure.

Herein, an upper portion, a lower portion, an upper side, a lower side, an upper surface, a lower surface, and the like, are used with reference to the attached drawings. For example, a first connection member may be disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a section taken along a plane in the vertical direction, and an example thereof may be a cross-sectional view illustrated in the drawings. In addition, a horizontal cross section refers to a section taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a block diagram illustrating an example electronic device system.

Referring to FIG. 1, an electronic device 1000 may include a main board (or mother board) 1010 having chip related components 1020, network related components 1030, electrical components 1040, a combination thereof, and the like. In an example and as illustrated, the chip-related components 1020, the network-related components 1030, and the electrical components 1040 may be considered as "on-board" components that are installed on the main board 1010, as opposed to other electrical components that may be external to the main board 1010 and electrically connected thereto via signal lines 1090. The chip-related components 1020, network-related components 1030, and the electrical components 1040 may be connected to each other and to the other external components of the main board 101 via signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), a combination thereof, and the like. However, the chip related components 1020 are not limited thereto, but may also include other types of chip related components, without departing from the scope of the disclosure. In addition, although illustrated as discreet components, two or more chip related components 1020 may be combined with each other.

The network related components 1030 may include one or more electronic components for implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols, a combination thereof, and the like. However, the network related components 1030 are not limited thereto, but may also include a variety of other wireless or wired standards or protocols, without departing from the scope of the disclosure. In addition, although illustrated as discreet components, the network related components 1030 may be combined with each other, and may further be combined with the chip related components 1020.

Electrical components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), a combination thereof, and the like. However, the electrical components 1040 are not limited thereto, but may also include passive components used for various other purposes, or the like. In addition, two or more electrical components 1040 may be combined with each other, or one or more electrical components 1040 may be combined with the chip related components 1020 and/or the network related components 1030.

Depending on a type of the electronic device 1000, and as discussed above, the electronic device 1000 may include electrical components that may be external to main board 1010. These electrical components may include, for example, a camera module 1050, an antenna 1060, a display device 1070, and a battery 1080. Although not illustrated expressly, an audio codec, a video codec, a power amplifier, a compass, an accelerometer, a gyroscope, a speaker, a mass storage unit (for example, a hard disk drive), a compact disk (CD) drive, a digital versatile disk (DVD) drive, a combination thereof, and the like. It will be understood that the components in the electronic device 1000 are not limited thereto, and the electronic component 1000 may include other components depending on the application and user requirement.

In an example, the electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, a combination thereof, and the like. However, the electronic device 1000 is not limited thereto, and may be or include other electronic data processing devices.

Figure 2:
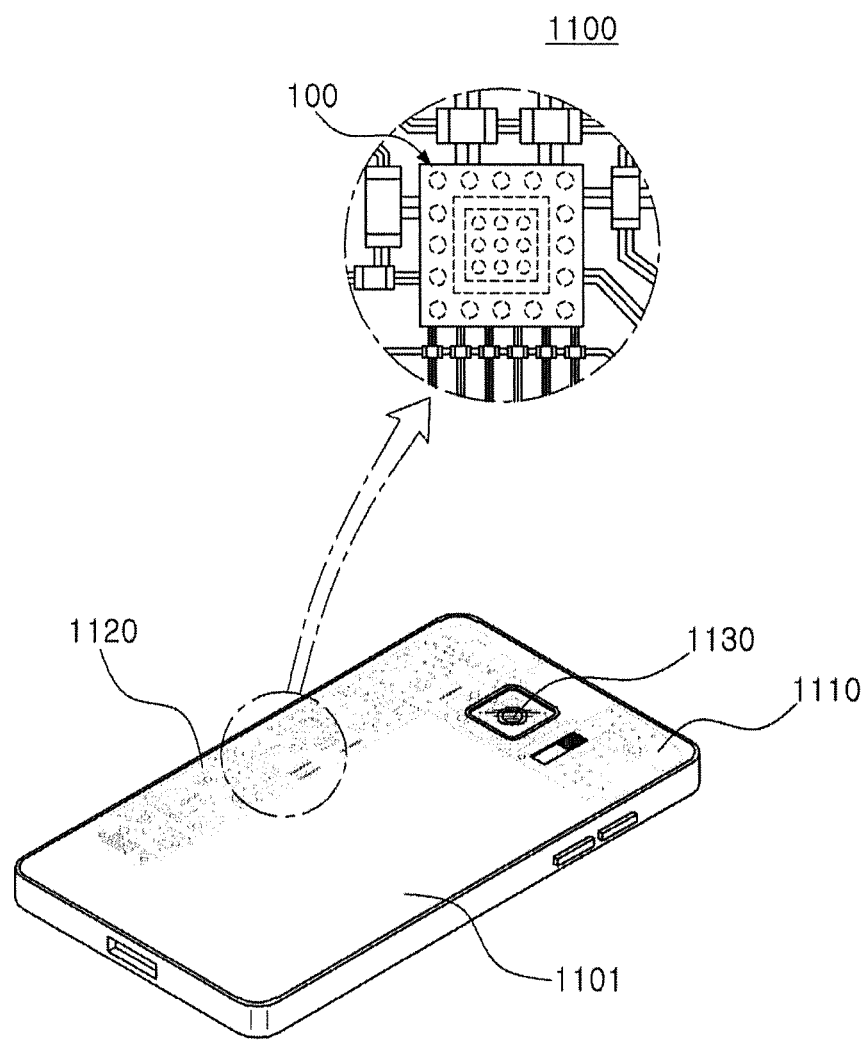
FIG. 2 is a schematic perspective view of an example electronic device.

FIG. 2 is a schematic perspective view of an example electronic device 1100. In an embodiment, the electronic device 1100 may be or include one or more of the electronic devices 1000 mentioned above.

Referring to FIG. 2, a semiconductor package may be used for various purposes in the various electronic devices 1000 as described above. For example, a main board 1110 may be accommodated in a body 1101 of the electronic device 1100, which, as illustrated, may be a smartphone, and various electronic components 1120 may be physically or electrically connected to the main board 1110. However, the electronic device 1100 is not limited thereto. In addition, other components that may or may not be physically or electrically connected to the main board 1110, such as a camera module 1130, may be accommodated in the body 1101. Some of the electronic components 1120 may be the chip related components, for example, an application processor, a signal processor, etc. However, the electronic components 1120 are not limited thereto.

Semiconductor Package

Generally, multiple electrical circuits are integrated in a semiconductor chip. The semiconductor chip may be damaged due to external physical or chemical impacts. Therefore, the semiconductor chip may be packaged before using in an electronic device.

Here, semiconductor packaging may be required due to a difference in size of electrical connections between the semiconductor chip and a main board of the electronic device. In detail, a size of connection pads of the semiconductor chip and intervals between the connection pads of the semiconductor chip are substantially smaller than sizes of component mounting pads of the main board and intervals between the component mounting pads of the main board. Therefore, it may be difficult to directly mount the semiconductor chip on the main board, and packaging technology may reduce a difference in the size of the connections between the semiconductor chip and the main board.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
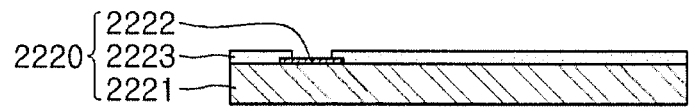
FIG. 3A is a schematic cross-sectional view of a fan-in semiconductor package prior to being packaged.
Figure 3B:
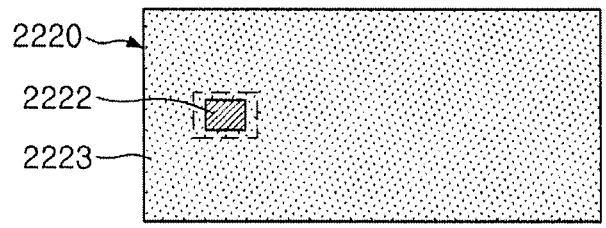
FIG. 3B illustrates a plan view of the fan-in semiconductor package of FIG. 3A.
Figure 3C:
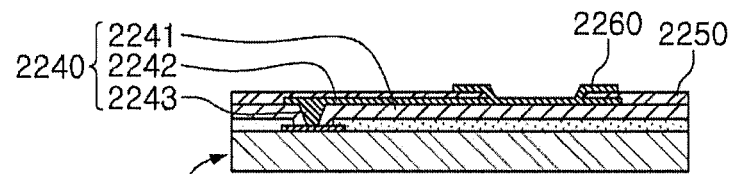
FIG. 3C is a schematic cross-sectional view of the fan-in semiconductor package of FIGS. 3A and 3B after being packaged.
Figure 3D:
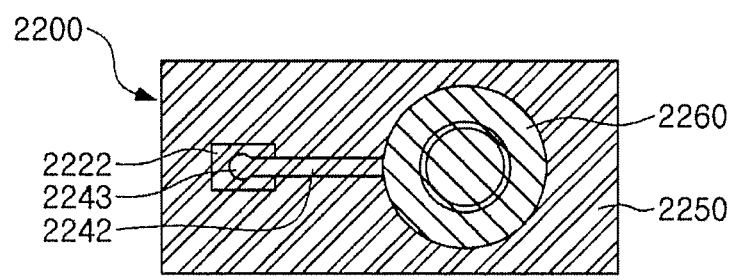
FIG. 3D illustrates a plan view of the fan-in semiconductor package of FIG. 3C.

FIG. 3A is a schematic cross-sectional view of a fan-in semiconductor package prior to being packaged. FIG. 3B illustrates a plan view of the fan-in semiconductor package of FIG. 3A. FIG. 3C is a schematic cross-sectional view of the fan-in semiconductor package of FIGS. 3A and 3B after being packaged. FIG. 3D illustrates a plan view of the fan-in semiconductor package of FIG. 3C.

FIGS. 4A-4G illustrate the processing steps for manufacturing the fan-in semiconductor package in FIGS. 3C-3D.

Referring to FIGS. 3A-3D and 4A-4G, a semiconductor chip 2220 may be, for example, an integrated circuit (IC), having a body 2221 including silicon (Si), germanium (Ge), gallium arsenide (GaAs), a combination thereof, and the like, connection pads 2222 formed on one surface of the body 2221 and including a conductive material such as aluminum (Al), or the like, and a passivation layer 2223 such as an oxide film, a nitride film, a combination thereof, and the like, formed on one surface of the body 2221 and at least partially covering the connection pads 2222. Since the connection pads 2222 are relatively smaller in size, it is difficult to mount the integrated circuit (IC) on an intermediate printed circuit board (PCB) as well as on the main board of the electronic device.

Figure 4A:
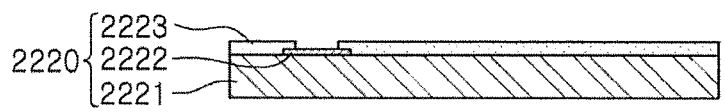
FIGS. 4A-4G illustrate the processing steps for manufacturing the fan-in semiconductor package in FIGS. 3C-3D.
Figure 4B:
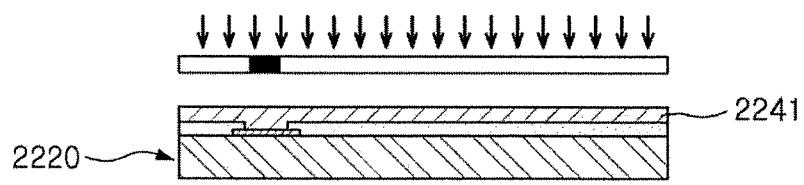
Figure 4C:
Figure 4D:
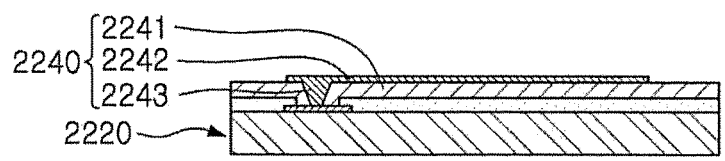

Therefore, an connection member 2240 may be formed depending on a size of the semiconductor chip 2220 on the semiconductor chip 2220 in order to redistribute the connection pads 2222. FIG. 4A illustrates the fan-in semiconductor package of FIG. 3A. Referring to FIGS. 4B, 4C and 4D, to form the connection member 2240, an insulating layer 2241 may be deposited on the semiconductor chip 2220. More specifically, the insulating layer 2241 may be deposited over the passivation layer 2223 and the connection pads 2222. The insulating layer 2241 may include an insulating material such as a photoimagable dielectric (PID) resin. As illustrated in FIGS. 4B and 4C, a via hole 2243$h$ may then be formed in the insulating layer 2241 using photolithography and etching processes. Briefly, light 2217 of a specific wavelength is shined over the insulating layer 2241 through a mask 2215 having a pattern of the via hole 2243$h$ formed therein. The etching process may be performed to remove the insulating layer 2241 to form the via 2243 (FIG. 4D).

Figure 4E:
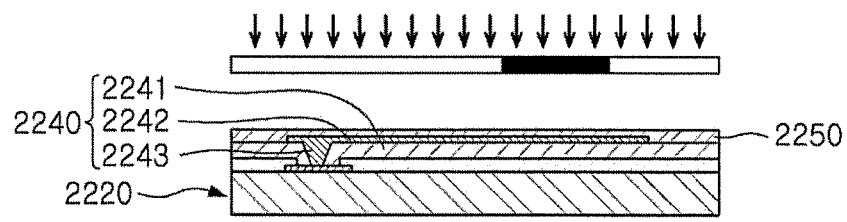
Figure 4F:
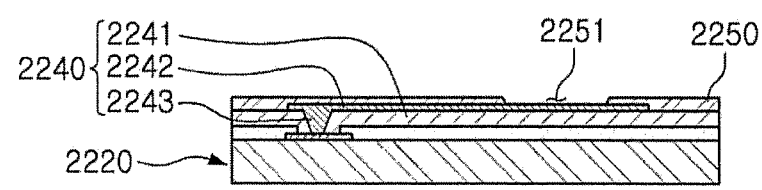

As illustrated in FIG. 4D, wiring patterns 2242 may then be formed on the insulating layer 2241 and in the via 2243 to connect to the connection pads 2222. Referring to FIGS. 4E and 4F, a passivation layer 2250 protecting the connection member 2240 may be formed, and photolithography and etching processes may be performed again to form an opening 2251 in the passivation layer 2250. Briefly, the photolithography and etching processes may include shining light on the passivation layer 2250 via a mask 2219 including a pattern corresponding to the opening 2251. The passivation layer 2250 is then etched away to form the opening 2251 and expose the underlying wiring patterns 2242.

Figure 4G:
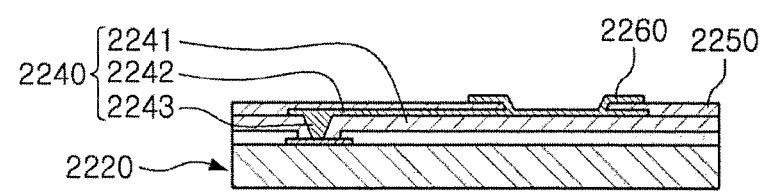

As illustrated in FIG. 4G, an under-bump metal layer 2260 may be deposited in the opening 2251, and the fan-in semiconductor package of FIG. 3D may be obtained. Thus, a fan-in semiconductor package 2200 including the semiconductor chip 2220, the connection member 2240, the passivation layer 2250, and the underbump metal layer 2260 may be manufactured through multiple processing steps.

As described above, in the fan-in semiconductor package, all of the connection pads 222, which, for example, may be used as input/output (I/O) terminals of the semiconductor chip 2220, are disposed inside the semiconductor chip. As a result, the fan-in semiconductor package may have improved electrical characteristics and may be produced at a low cost. Due to the low cost and improved electrical characteristics, a variety of portable electronic devices, such as smartphones, media players, and the like, include components manufactured in a fan-in semiconductor package form. Such components allow faster signal transfer and have a compact size.

Because of the relatively small size of the connection pads 2222 and the small interval (or separation) between adjacent connection pads 2222 of the semiconductor chip, an intermediate circuit (also referred to as an interposer substrate) may be used to mount the fan-in semiconductor package on the main board (e.g., main board 1010 in FIG. 1) of the electronic device.

Figure 5:
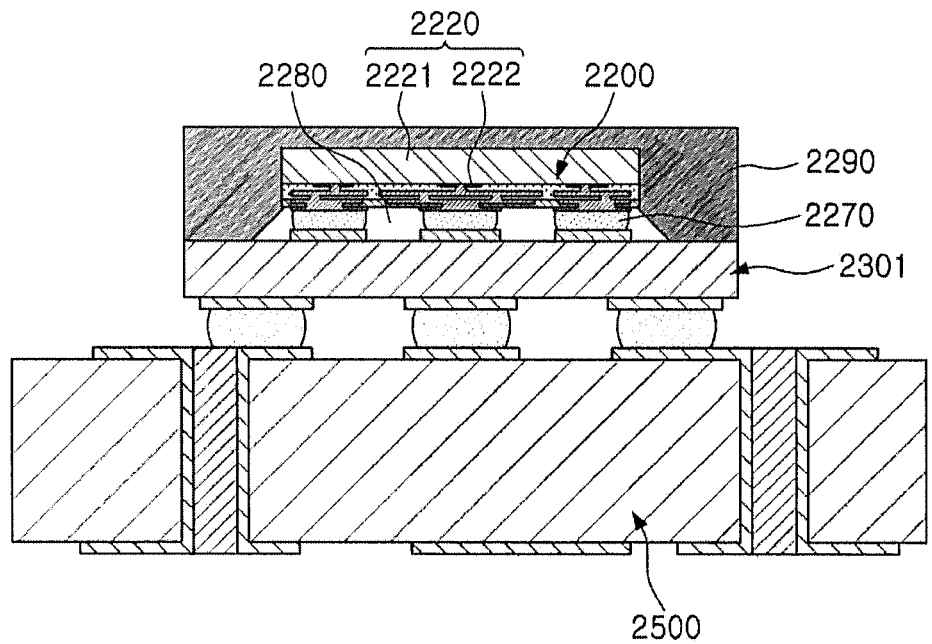
FIG. 5 is a schematic cross-sectional view of a fan-in semiconductor package mounted on an interposer substrate which is mounted on a main board of an electronic device.

FIG. 5 is a schematic cross-sectional view of a fan-in semiconductor package mounted on an interposer substrate which is then mounted on a main board of an electronic device.

Figure 6:
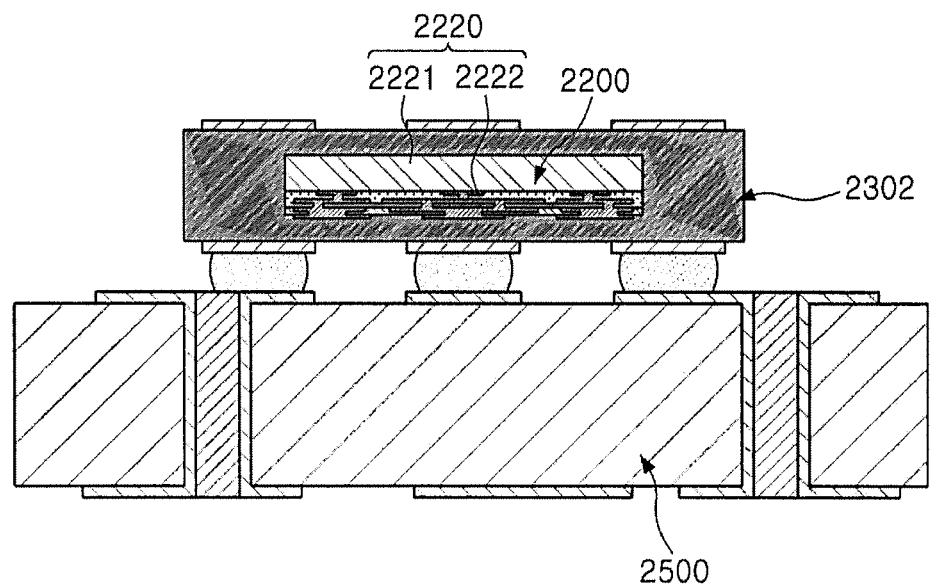
FIG. 6 is a schematic cross-sectional view of a fan-in semiconductor package embedded in an interposer substrate which is mounted on a main board of an electronic device.

FIG. 6 is a schematic cross-sectional view of a fan-in semiconductor package embedded in an interposer substrate which is then mounted on a main board of an electronic device.

Referring to FIGS. 5 and 6, and with continued reference to FIGS. 3A-3D and 4, in a fan-in semiconductor package 2200, the connection pads 2222 of the semiconductor chip 2220 may be redistributed through an interposer substrate 2301, and the fan-in semiconductor package 2200 may be mounted on a main board 2500 of an electronic device by mounting the fan-in semiconductor package 2200 on the interposer substrate 2301. In this case, solder balls 2270, and the like, may be fixed to the semiconductor package 2200 by an underfill resin 2280, or the like. The external surface of the semiconductor chip 2220 may be covered with a molding material 2290. Alternatively, as illustrated in FIG. 6, in order to redistribute the connection pads 2222 of the semiconductor chip 2220, the fan-in semiconductor package 2200 may be embedded in an interposer substrate 2302, and the fan-in semiconductor package 2200 may then be mounted on a main board 2500 of an electronic device.

Thus, connection pads 2222 having a relatively small size and small interval (or separation) may be connected to the main board of the electronic device.

Fan-Out Semiconductor Package

Figure 7:
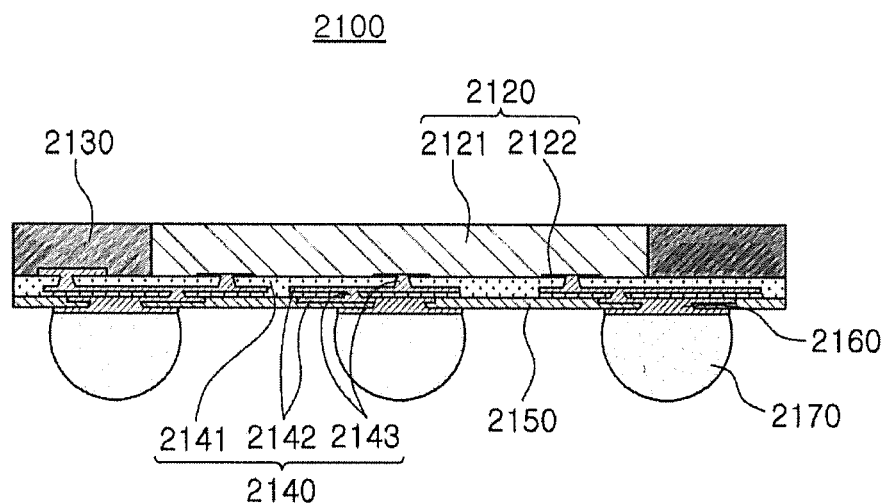
FIG. 7 is a schematic cross-sectional view of a fan-out semiconductor package.

FIG. 7 is a schematic cross-sectional view illustrating a fan-out semiconductor package 2100.

Referring to FIG. 7, the fan-out semiconductor package 2100 may include a semiconductor chip 2120 having a body 2121 that is protected by an encapsulant 2130. The connection pads 2122 of the semiconductor chip 2120 may be redistributed externally (or otherwise "brought" to the outside) of the semiconductor chip 2120 by an interconnection member 2140. As illustrated, a passivation layer 2150 may be formed on or otherwise deposited on the interconnection member 2140, and an under-bump metal layer 2160 may be formed or otherwise deposited in openings of the passivation layer 2150. Solder balls 2170 may be formed or otherwise deposited on the under-bump metal layer 2160. The interconnection member 2140 may include an insulating layer 2141, redistribution layers 2142 formed on the insulating layer 2141, and vias 2143 connecting the connection pads 2122 and the redistribution layers 2142 with each other.

As described above, in the fan-in semiconductor package, all connection pads of the semiconductor chip may be disposed inside the semiconductor chip. Therefore, when a size of the semiconductor chip is reduced, a size and a pitch of balls may also be reduced, and, therefore, a non-standardized ball layout may be used in the fan-in semiconductor package. On the other hand, in the fan-out semiconductor package disclosed in FIG. 7, the connection pads (I/O terminals) of the semiconductor chip are redistributed external to the semiconductor chip through the interconnection member formed on the semiconductor chip. Therefore, even if a size of the semiconductor chip is reduced, it may be possible to use a standardized ball layout in the fan-out semiconductor package. Thus, an interposer may not be required to mount the fan-out semiconductor package on the main board of the electronic device, as described below.

Figure 8:
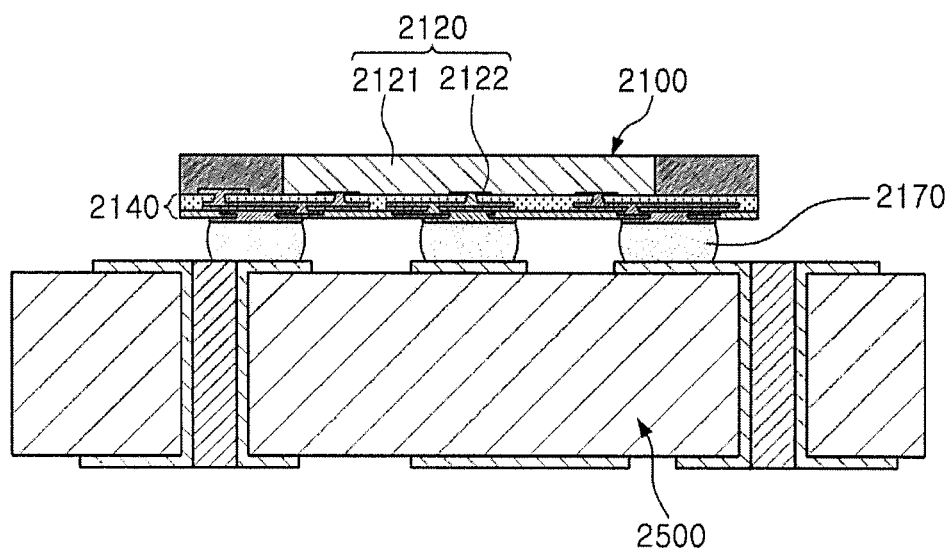
FIG. 8 is a schematic cross-sectional view of a fan-out semiconductor package mounted on a main board of an electronic device.

FIG. 8 is a schematic cross-sectional view of the fan-out semiconductor package 2100 mounted on a main board 2500 of an electronic device.

Referring to FIG. 8, the fan-out semiconductor package 2100 may be mounted on the main board 2500 of an electronic device using solder balls 2170, or similar connectors. The fan-out semiconductor package 2100 includes the connection member 2140 formed on the semiconductor chip 2120 for redistributing the connection pads 2122 to a fan-out region having an area greater than that of the semiconductor chip 2120, such that a standardized ball layout may be used in the fan-out semiconductor package 2100. As a result, the fan-out semiconductor package 2100 may be mounted on the main board 2500 of the electronic device without using a separate interposer substrate.

As described above, since the fan-out semiconductor package may be mounted on the main board of the electronic device without using the separate interposer substrate, a thickness of the fan-out semiconductor package may be lower than that of the fan-in semiconductor package using the interposer substrate. As a result, a size of the fan-out semiconductor package may be reduced. In addition, the fan-out semiconductor package has improved thermal characteristics and electrical characteristics, and a use thereof in a mobile product (e.g., a smartphone) may be desirable. Thus, the fan-out semiconductor package may be relatively more compact than a general package-on-package (POP) type using a printed circuit board (PCB) and warpage may be avoided.

As discussed above, in the fan-out semiconductor package, the semiconductor chip is mounted on the main board of the electronic device, and the semiconductor chip is protected from external impacts. In contrast, the fan-in semiconductor package is embedded in an interposer substrate, which is then mounted on the main board of the electronic device.

A fan-out semiconductor package that may block electromagnetic interference (EMI) more effectively and may have improved heat dissipation quality is hereinafter described with reference to the drawings.

Figure 9:
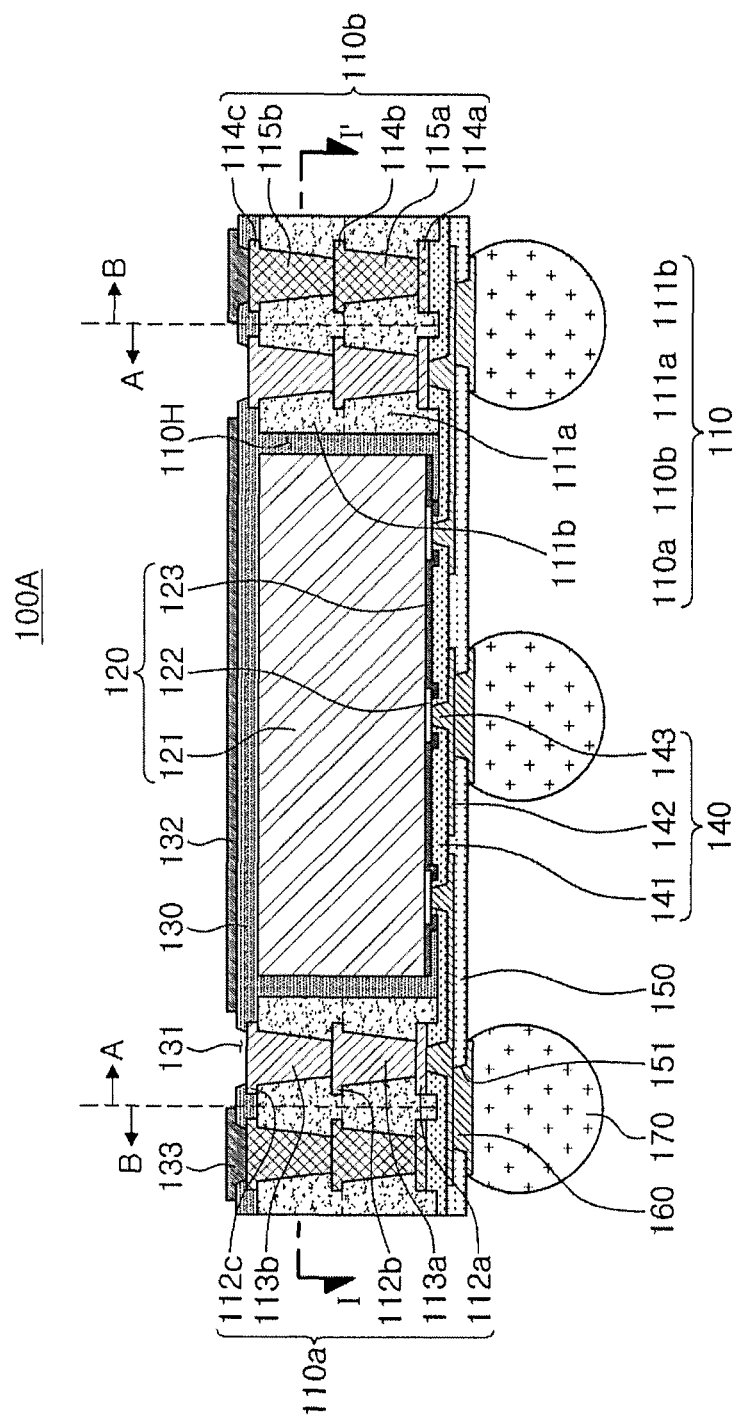
FIG. 9 is a schematic cross-sectional view of an example fan-out semiconductor package.

FIG. 9 is a schematic cross-sectional view of an example fan-out semiconductor package 100A.

Figure 10:
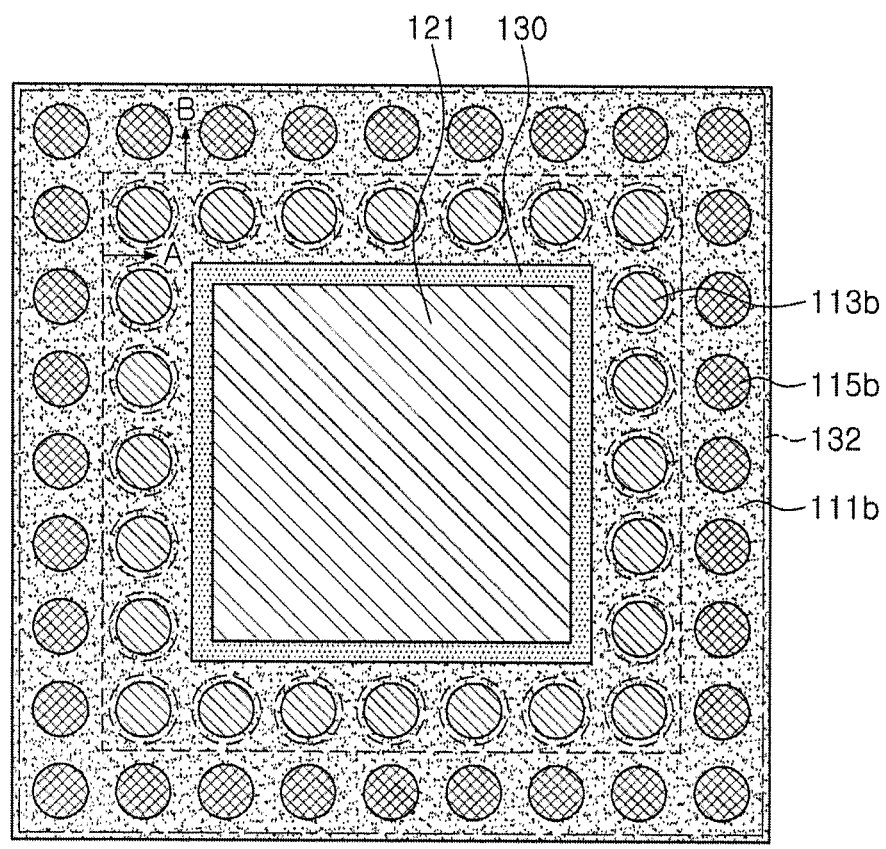
FIG. 10 is a schematic plan view of the fan-out semiconductor package of FIG. 9 taken along line I-I'.

FIG. 10 is a schematic plan view of the fan-out semiconductor package 100A taken along line I-I' of FIG. 9.

Figure 11:
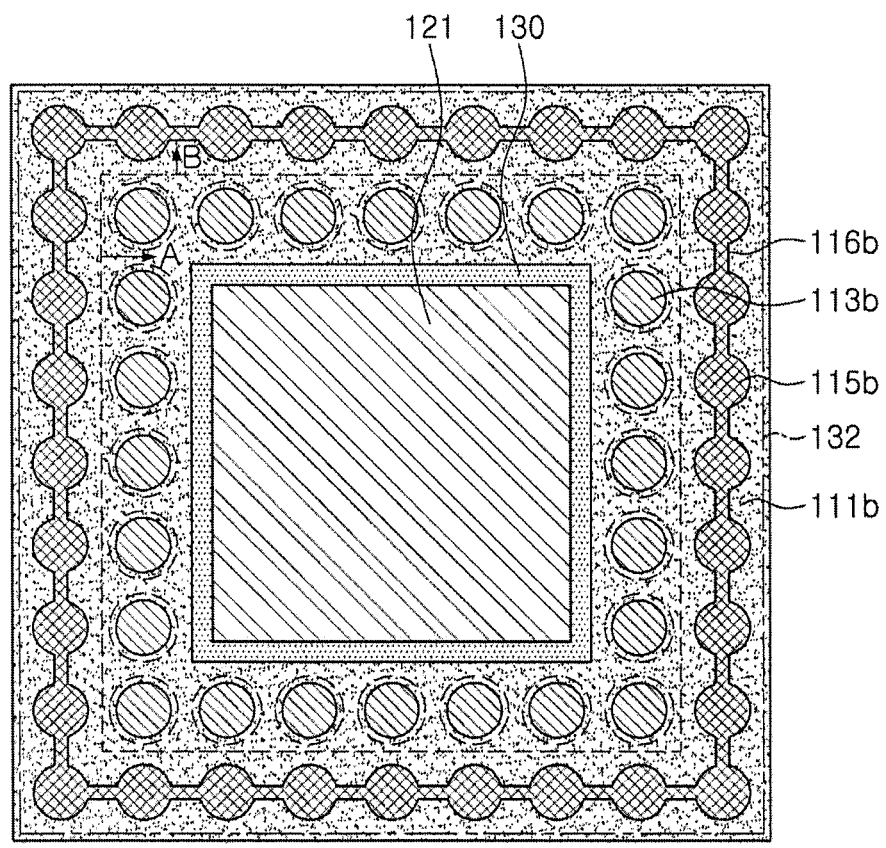
FIG. 11 is another schematic plan view of the fan-out semiconductor package of FIG. 9 taken along line I-I'.

FIG. 11 is another schematic plan view of the fan-out semiconductor package 100A taken along line I-I' of FIG. 9.

Figure 12:
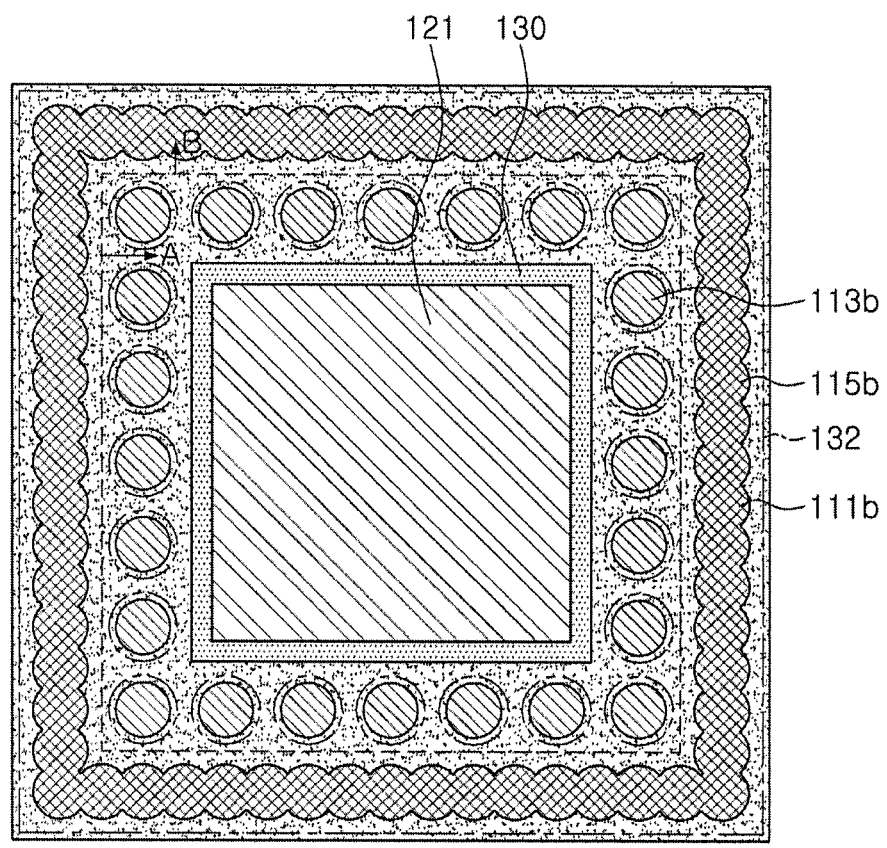
FIG. 12 is yet another schematic plan view of the fan-out semiconductor package of FIG. 9 taken along line I-I'.

FIG. 12 is still another schematic plan view of the fan-out semiconductor package 100A taken along line I-I' of FIG. 9.

Referring to FIGS. 9-12, the fan-out semiconductor package 100A according to an exemplary embodiment in the present disclosure may include a first connection member 110 (discussed below) having a through-hole 110H, a semiconductor chip 120 disposed in the through-hole 110H of the first connection member 110 and having an active surface with connection pads 122 disposed thereon and an inactive surface opposing the active surface, an encapsulant 130 encapsulating at least portions of the first connection member 110 and the inactive surface of the semiconductor chip 120, and a second connection member 140 disposed on the first connection member 110 and the active surface of the semiconductor chip 120. The first connection member 110 may include redistribution layers 112a, 112b, 112c, 114a, 114b, and 114c electrically connected to the connection pads 122 of the semiconductor chip 120. The second connection member 140 may also include a redistribution layer 142 electrically connected to the connection pads 122 of the semiconductor chip 120. The redistribution layers 112a, 112b, 112c, 114a, 114b, and 114c of the first connection member 110 may include signal patterns and ground patterns. The first connection member 110 may include a plurality of dummy vias 115a and 115b connected to the ground patterns and surrounding the semiconductor chip 120. The first connection member 110 may include a plurality of signal vias 113a and 113b connected to the signal patterns and surrounded by the plurality of dummy vias 115a and 115b. As used herein, 'dummy' vias (dummy vias 115a and 115b) include vias which do not provide signal transfer functionality in the fan-out semiconductor package 100A. The dummy vias have a structure similar to the signals vias 113a and 113b, but unlike the signals vias 113a and 113b do not interconnect signals applied there to between different portions of the fan-out semiconductor package 100A. The dummy vias 115a, 115b are connected only to the ground patterns and are insulated from other signal patterns, such as, signal patterns providing control signals, data signals, signals pertaining to networking protocols, and the like, which patterns communicate signals in the fan-out semiconductor package 100A during operation. The dummy vias 115a, 115b may be structurally similar to the signal vias 113a, 113b but do not provide any functionality during operation.

The semiconductor package according to the related art provided poor electromagnetic interference (EMI) blocking. Therefore, in the related art semiconductor package having large EMI due to a large amount of radiated electromagnetic waves, a shield can is installed to block the EMI. However, using the shield can reduces an available mounting area and increases manufacturing costs, increases noise between unit components in the shield can, and increases stress concentration on a main board due to manner in which the shield can is mounted. In addition, even though the shield can is used, an amount of electromagnetic waves radiated in a unit component level increases with an increase in high-speed signal transmission. This requires a design optimizing process that is performed numerous times in a set developing process in order to receive signals at levels demanded by communications companies. Such a process is costly, unreliable, and time-consuming. Therefore, a structure and a method capable of effectively performing EMI blocking in a unit component level of the semiconductor package is desired.

In the fan-out semiconductor package 100A according to the exemplary embodiment, the dummy vias 115a and 115b may block EMI and may form a wall type structure in the outer portion B of the first connection member 110 and that encloses or otherwise surrounds components disposed in an inner portion A of the first connection member 110, such as the semiconductor chip 120 and the signal vias 113a and 113b. Stated otherwise, the dummy vias 115a and 115b are formed about the outer edge (or peripheral) of the first connection member 110 and surround the semiconductor chip 120 and the signal vias 113a and 113b, which are located radially inward from the outer edge. This structure may reduce noise radiation in individual unit component levels without requiring additional processing steps and may block EMI. Therefore, an existing shield can method may not be used, and a noise reducing method for improving receiving sensitivity in a set level may be used in a unit component level to reduce a burden of a set design and verification. Particularly, the dummy vias 115a and 115b may be formed along the outer edge of the first connection member 110 to block EMI generated in the redistribution layers 112a, 112b, 112c, 114a, 114b, and 114c, or the like. In this structure, the dummy vias 115a and 115b may also perform a heat dissipation function to improve heat dissipation. The dummy vias 115a and 115b may be connected to ground patterns of the first connection member 110 and/or the second connection member 140 to further improve design efficiency. The plurality of dummy vias 115a and 115b may be spaced apart from each other by a predetermined interval or may be connected to each other by a plurality of line vias 116b. Alternatively, the plurality of dummy vias 115a and 115b may overlap each other so that a gap therebetween is absent or otherwise minimized.

The fan-out semiconductor package 100A according to the exemplary embodiment may further include a metal layer 132 disposed on the encapsulant 130 and covering at least a portion of the inactive surface of the semiconductor chip 120. The metal layer 132 may be connected to the dummy vias 115a and 115b through vias 133. In this structure, most of the surface of the semiconductor chip 120 may be surrounded by a metal. Therefore, the EMI may be more effectively blocked, and improved heat dissipation may be obtained. The metal layer 132 may be formed by a method of coating or plating using a known metal. The metal layer 132 may also be utilized as a ground pattern, if necessary. Therefore, the dummy vias 115a and 115b may be connected to a ground of the entire fan-out semiconductor package 100A. The encapsulant 130 may have openings 131 formed in the metal layer 132 and exposing pad patterns connected to the signal vias 113a and 113b. Therefore, the metal layer 132 may not be connected to the signal vias 113a and 113b.

The respective components included in the fan-out semiconductor package 100A according to the exemplary embodiment will hereinafter be described in more detail.

The first connection member 110 may maintain rigidity of the fan-out semiconductor package 100A, and keep a thickness of the encapsulant 130 uniform. The fan-out semiconductor package 100A may be used as a portion of a package-on-package (POP) by the first connection member 110. The first connection member 110 may include the redistribution layers 112a, 112b, 112c, 114a, 114b, and 114c to redistribute the connection pads 122 of the semiconductor chip 120 and reduce the number of layers of the second connection member 140. The semiconductor chip 120 may be disposed in the through-hole 110H to be spaced apart from the first connection member 110 by a predetermined distance. Side surfaces of the semiconductor chip 120 may be surrounded by the first connection member 110. However, such a configuration is only an example, and the through-hole 110H of the first connection member 110 may be modified, and the fan-out semiconductor package 100A may perform another functions as required by application and design depending on such a form.

The first connection member 110 may include a first insulating layer 111a, a second insulating layer 111b, a signal part 110a, and a dummy part 110b. The signal part 110a may be disposed on the inner portion A of the first connection member 110. The dummy part 110b may be disposed on the outer portion B of the first connection member 110. The signal part 110a may include a first signal via 113a penetrating through the first insulating layer 111a and a second signal via 113b penetrating through the second insulating layer 111b. The dummy part 110b may include a first dummy via 115a penetrating through the first insulating layer 111a and a second dummy via 115b penetrating through the second insulating layer 111b. The signal part 110a may include a first redistribution layer 112a, a second redistribution layer 112b, and a third redistribution layer 112c including signal patterns, pad patterns for the signal vias, and the like. The signal patterns, the pad patterns for the signal vias, and the like, may be electrically connected to each other by the first signal via 113a and the second signal via 113b. The dummy part 110b may include a first redistribution layer 114a, a second redistribution layer 114b, and a third redistribution layer 114c including dummy patterns, pad patterns for the dummy vias, and the like. The dummy patterns, the pad patterns for the dummy vias, and the like, may be electrically connected to each other by the first dummy via 115a and the second dummy via 115b. In addition to the signal patterns and the pad patterns for the signal vias, power patterns, pad patterns for power vias, and the like, may be disposed on the inner portion A of the first connection member 110, and the power vias electrically connecting the power patterns, the pad patterns for power vias, and the like, to each other may also be disposed on the inner portion A of the first connection member 110. The ground patterns may be disposed on the outer portion B of the first connection member 110 in which the dummy vias 115a and 115b are disposed and also in the inner portion A of the first connection member 110 separately from the dummy vias 115a and 115b.

The first redistribution layers 112a and 114a may be in contact with the second connection member 140, and may be embedded in the first insulating layer 111a. The second redistribution layers 112b and 114b may be disposed on a surface of the first insulating layer 111a opposite the surface of the first insulating layer 111a in which the first redistribution layers 112a and 114a are embedded. The second insulating layer 111b may be disposed on the first insulating layer 111a, and may cover the second redistribution layers 112b and 114b. The third redistribution layers 112c and 114c may be disposed on the second insulating layer 111b. The first to third redistribution layers 112a, 112b, 112c, 114a, 114b, and 114c may be electrically connected to the connection pads 122. Since the first redistribution layers 112a and 114a are embedded in the first insulating layer 111a, a thickness of an insulating layer 141 of the second connection member 140 may be substantially constant. Since the first connection member 110 may include a relatively large number of redistribution layers 112a, 112b, 112c, 114a, 114b, and 114c, the structure of the second connection member 140 is relatively less complex than the first connection member 110. Therefore, a decrease in a yield due to defects occurring during manufacture of the second connection member 140 may be minimized. The first redistribution layers 112a and 114a may be recessed in the first insulating layer 111a, such that a lower surface of the first insulating layer 111a may have a step (or step profile) with respect to lower surfaces of the first redistribution layers 112a and 114a. Resultantly, when the encapsulant 130 is formed, contamination of the first redistribution layers 112a and 114a due to bleeding of the encapsulant 130 in the first redistribution layers 112a and 114a may be minimized. In addition, lower surfaces of the first redistribution layers 112a and 114a of the first connection member 110 may be disposed above a lower surface of the connection pad 122 of the semiconductor chip 120. In addition, a distance between a redistribution layer 142 of the second connection member 140 and the first redistribution layers 112a and 114a of the first connection member 110 may be greater than a distance between the redistribution layer 142 of the second connection member 140 and the connection pad 122 of the semiconductor chip 120. The second redistribution layers 112b and 114b formed in the first connection member 110 may be disposed on a level between the active surface and the inactive surface of the semiconductor chip 120.

Thicknesses of the redistribution layers 112a, 112b, 112c, 114a, 114b, and 114c of the first connection member 110 may be greater than that of the redistribution layer 142 of the second connection member 140. Since the first connection member 110 may have a thickness equal to or greater than that of the semiconductor chip 120 for maintaining uniformity in the thickness of the encapsulant 130, the redistribution layers 112a, 112b, 112c, 114a, 114b, and 114c may be of relatively larger size depending on a scale of the first connection member 110. On the other hand, the redistribution layers 142 of the second connection member 140 may be formed at a relatively small size to decrease the thickness.

For example, a material including an inorganic filler and an insulating resin may be used as materials of the insulating layers 111a and 111b. For example, a thermosetting resin such as an epoxy resin, a thermoplastic resin such as polyimide, or a resin including a reinforcing material such as an inorganic filler, for example, silica, alumina, a combination thereof, and the like, more specifically, Ajinomoto Build up Film (ABF), FR-4, Bismaleimide Triazine (BT), a photoimagable dielectric (PID) resin, BT, a combination thereof, and the like, may be used. Alternatively, a material in which a thermosetting resin or a thermoplastic resin is impregnated together with an inorganic filler in a core material such as a glass fiber (or a glass cloth or a glass fabric), for example, prepreg, a combination thereof, and the like, may also be used.

The redistribution layers 112a, 112b, 112c, 114a, 114b, and 114c may include a conductive material such as copper (Cu), aluminum (Al), silver (Ag), tin (Sn), gold (Au), nickel (Ni), lead (Pb), titanium (Ti), or alloys thereof. The redistribution layers 112a, 112b, 112c, 114a, 114b, and 114c may perform various functions depending on designs of their corresponding layers. For example, the redistribution layers 112a, 112b, 112c, 114a, 114b, and 114c may include ground (GND) patterns, power (PWR) patterns, signal (S) patterns, and the like. Here, the signal (S) patterns may include various signals except for the ground (GND) patterns, the power (PWR) patterns, and the like, such as data signals, control signals, and the like. In addition, the redistribution layers 112a, 112b, 112c, 114a, 114b, and 114c may include pad patterns for vias, pad patterns for connection terminals, and the like. A surface treatment layer may be formed on a surface of the pad pattern exposed through the opening 131. The surface treatment layer may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), a combination thereof, and the like.

A material of each of the vias 113a, 113b, 115a, and 115b may be a conductive material. Each of the vias 113a, 113b, 115a, and 115b may be completely filled with the conductive material, or the conductive material may also be formed along a wall of each via hole or in any location in the via hole for providing desired electrical connection. When holes for the vias 113a, 113b, 115a, and 115b are formed, some of the pad patterns of the first redistribution layers 112a and 114a and the second redistribution layers 112b and 114b may serve as a stopper, and it may be thus advantageous in a process that each of the vias 113a, 113b, 115a, and 115b has a tapered shape of which a width of an upper surface is greater than that of a lower surface. In this case, the vias 113a, 113b, 115a, and 115b may be integrated with portions of the second redistribution layers 112b and 114b and the third redistribution layers 112c and 114c, respectively. The signal vias 113a and 113b may be disposed on the inner side a of the first connection member 110. The dummy vias 115a and 115b may be disposed as a wall type structure at the outer portion B of the first connection member 110. The dummy vias 115a and 115b may surround the signal vias 113a and 113b, respectively. This structure may be efficient in blocking EMI generated in the semiconductor chip 120, or the like. In addition, heat dissipation may also be improved. The dummy vias 115a and 115b may be connected to ground patterns of the first connection member 110 and/or the second connection member 150 to further improve design efficiency. The plurality of dummy vias 115a and 115b may be spaced apart from each other by a predetermined interval or may be connected to each other by a plurality of line vias 116b. Alternatively, the plurality of dummy vias 115a and 115b may overlap each other so that a gap therebetween is absent or otherwise minimized.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, a combination thereof, and the like, but is not limited thereto. The semiconductor chip 120 may be formed on the basis of an active wafer. In this case, a base material of a body 121 may be silicon (Si), germanium (Ge), gallium arsenide (GaAs), a combination thereof, and the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, a combination thereof, and the like, or a double layer of an oxide layer and a nitride layer. A lower surface of the connection pad 122 may have a step with respect to a lower surface of the encapsulant 130 through the passivation layer 123. Resultantly, bleeding of the encapsulant 130 into the lower surface of the connection pads 122 may be minimized to some extent. An insulating layer, or the like, may also be further disposed in other required positions.

The encapsulant 130 may protect the semiconductor chip 120. An arrangement/placement of the encapsulant 130 is not limited to any specific configuration, and the encapsulant 130 surrounds at least portions of the semiconductor chip 120. For example, the encapsulant 130 may cover at least portions of the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. The materials used in the encapsulant 130 are not limited to any particular materials. For example, an insulating material may be used in the encapsulant 130. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, a combination thereof, and the like. In addition, the known molding material such as an epoxy molding compound (EMC), or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The metal layer 132 may be connected to the dummy vias 115a and 115b through vias 133. In this structure, the surface of the semiconductor chip 120 may be surrounded by a metal. Therefore, the EMI may be more effectively blocked, and improved heat dissipation may be obtained. The metal layer 132 may be formed by a method of coating or plating the known metal such as copper (Cu). The metal layer 132 may also be utilized as a ground pattern, if necessary. Therefore, the dummy vias 115a and 115b may be connected to a ground of the entire fan-out semiconductor package 100A. Opening 131 may be formed in the encapsulant 130 and the metal layer 132 and pad patterns connected to the signal vias 113a and 113b may be exposed. Therefore, the metal layer 132 may not be connected to the signal vias 113a and 113b.

The second connection member 140 may be configured to redistribute the connection pads 122 of the semiconductor chip 120. A plurality of connection pads 122 having various functions may be redistributed by the second connection member 140, and may be physically or electrically connected to an external source through connection terminals 170 to be described below depending on the functions. The second connection member 140 may include an insulating layer 141, the redistribution layer 142 disposed on the insulating layer 141, and vias 143 penetrating through the insulating layers 141 and connected to the redistribution layer 142. In the fan-out semiconductor package 100A according to the exemplary embodiment, the second connection member 140 may include a single layer, but may also include a plurality of layers.

An insulating material may be used as a material of the insulating layers 141. In this case, a photosensitive insulating material such as a PID resin may also be used as the insulating material. When the insulating layers 141 are multiple layers, materials of the insulating layers 141 may be the same as each other, or may be different from each other. When the insulating layers 141 are the multiple layers, the insulating layers 141 may be integrated with each other, such that boundaries therebetween may also not be apparent.

The redistribution layers 142 may substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof.

The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, control signals, and the like. In addition, the redistribution layers 142 may include various kinds of pad patterns, and the like.

The vias 143 may electrically connect the connection pads 122, the redistribution layers 142, or the like, formed on different layers, to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the via holes or in any desired location in the via hole. In addition, each of the vias 143 may have a desired shape, such as a tapered shape, a cylindrical shape, and the like.

The passivation layer 150 may be additionally configured to protect the second connection member 140 from external physical or chemical damage. The passivation layer 150 may have openings 151 exposing at least portions of the redistribution layer 142 of the second connection member 140. The openings may be provided in an amount of several tens to several thousands. A material of the passivation layer 150 is not particularly limited, but may be a photosensitive insulating material such as a PID resin. Alternatively, a solder resist may also be used as the material of the passivation layer 150. Alternatively, an insulating resin that may not include a core material, but include a filler, for example, ABF, including an inorganic filler and an epoxy resin, may be used as the material of the passivation layer 150. When the insulating material including the inorganic filler and the insulating resin, such as the ABF, or the like, is used as the material of the passivation layer 150, the insulating layer 141 of the second connection member 140 may also include an inorganic filler and an insulating resin. In this case, a weight percent of the inorganic filler included in the passivation layer 150 may be greater than that of the inorganic filler included in the insulating layer 141 of the second connection member 140. In this case, the passivation layer 150 may have a relatively low coefficient of thermal expansion (CTE), and may be utilized to control the warpage.

An under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second connection member 140 opened through the openings 151 of the passivation layer 150. The under-bump metal layer 160 may be formed in the openings 151 of the passivation layer 150 by a desired metallization method using known conductive metals.

The connection terminals 170 may be additionally configured to physically or electrically externally connect the fan-out semiconductor package 100A. For example, the fan-out semiconductor package 100A may be mounted on the main board of the electronic device using the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified depending on design and application. For example, a plurality of connection terminals 170 may be provided equal to the number of connection pads 122 of the semiconductor chip 120, but are not limited thereto. As an example, several tens to several thousands or more or several tens to several thousands or less connection terminals 170 may be provided. When the connection terminals 170 are solder balls, the connection terminals 170 may cover side surfaces of the underbump metal layer 160 extending onto one surface of the passivation layer 150, and connection reliability may be more excellent.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have improved reliability as compared to a fan-in package, may implement a plurality of input/output (I/O) terminals, and may facilitate 3D interconnectivity. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Meanwhile, although not illustrated, a metal layer may be further disposed on a wall of the through-hole 110H. The metal layer may effectively dissipate heat generated by the semiconductor chip 120. In addition, the metal layer may also block electromagnetic waves. In addition, a separate passive component such as a capacitor, an inductor, or the like, may be further disposed in the through-hole 110H. In addition, a plurality of semiconductor chips 120 may be disposed in the through-hole 110H. In addition, the number of through-holes 110H may be plural and semiconductor chips 120 or passive components may be disposed in the through-holes 110H, respectively. In addition, components other than the structures described above may also be used.

Figure 13:
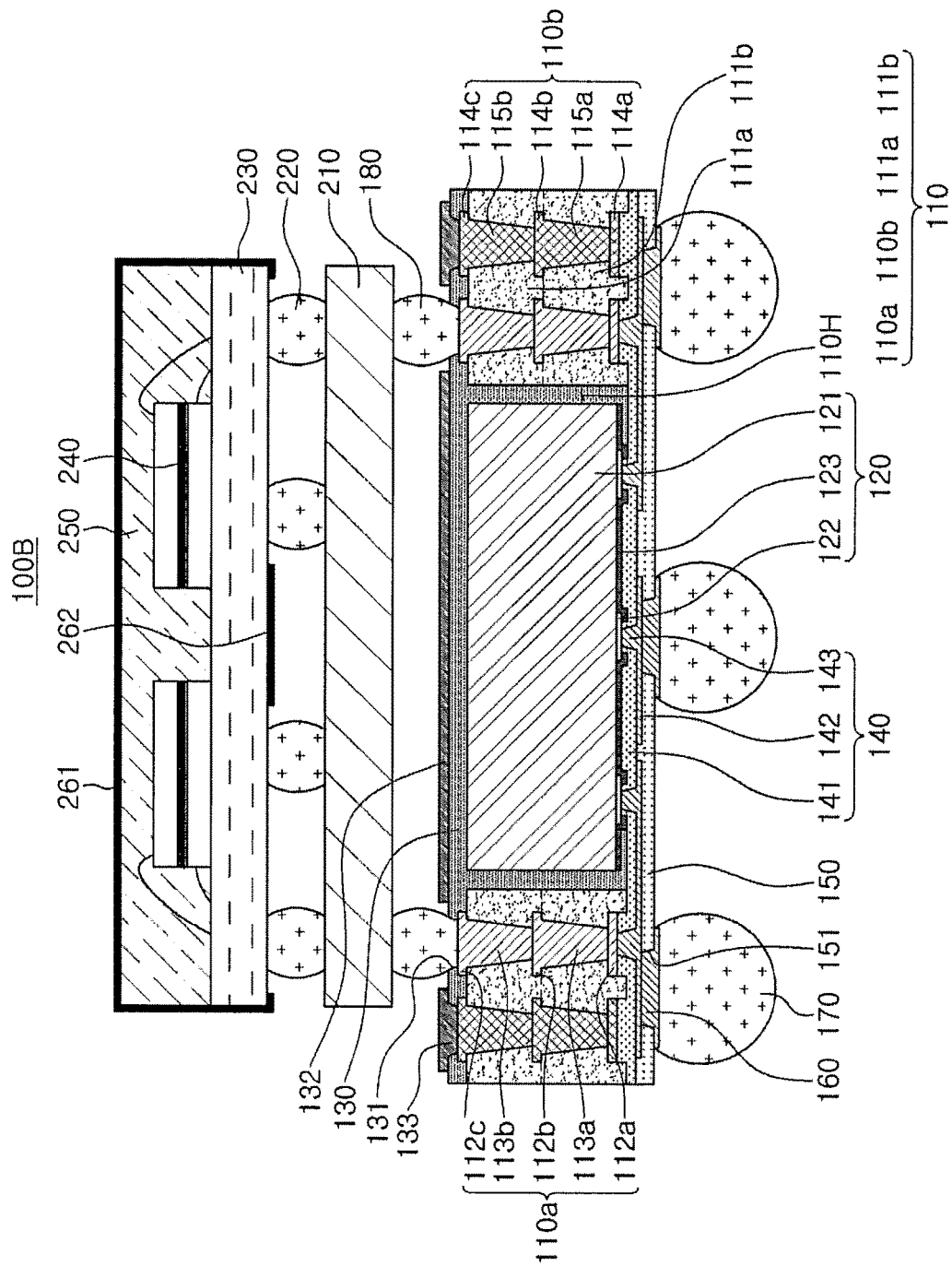
FIG. 13 is a schematic cross-sectional view of a modified example fan-out semiconductor package of FIG. 9.

FIG. 13 is a schematic cross-sectional view of another example of a fan-out semiconductor package 100B.

Referring to FIG. 13, the fan-out semiconductor package 100B may have a package-on-package (POP) type structure. The fan-out semiconductor package 100B may be similar in some respects to the fan-out semiconductor package 100A in FIGS. 9-12, and therefore may be best understood with reference thereto where like numerals designate like components not described again in detail. The fan-out semiconductor package 100B may further include an interposer substrate 210 disposed on the encapsulant 130 and electrically connected to the signal vias 113a and 113b, and the like, through connection terminals 180 formed in the openings 131 and a memory package disposed on the interposer substrate 210. The memory package may include a wiring substrate 230, a memory 240 disposed on the wiring substrate 230 and electrically connected to the wiring substrate 230 by wire bonding, or the like, an encapsulant 250 disposed on the wiring substrate 230 and encapsulating the memory 240, and connection terminals 220 connecting the wiring substrate 230 to the interposer substrate 210. In this case, a metal layer 261 surrounding the encapsulant 250 may be formed in order to block EMI of the memory package. In addition, a metal layer 262 may be formed in a region except for a region in which the connection terminals 220 are disposed, on a lower surface of the wiring substrate 230.

Figure 14:
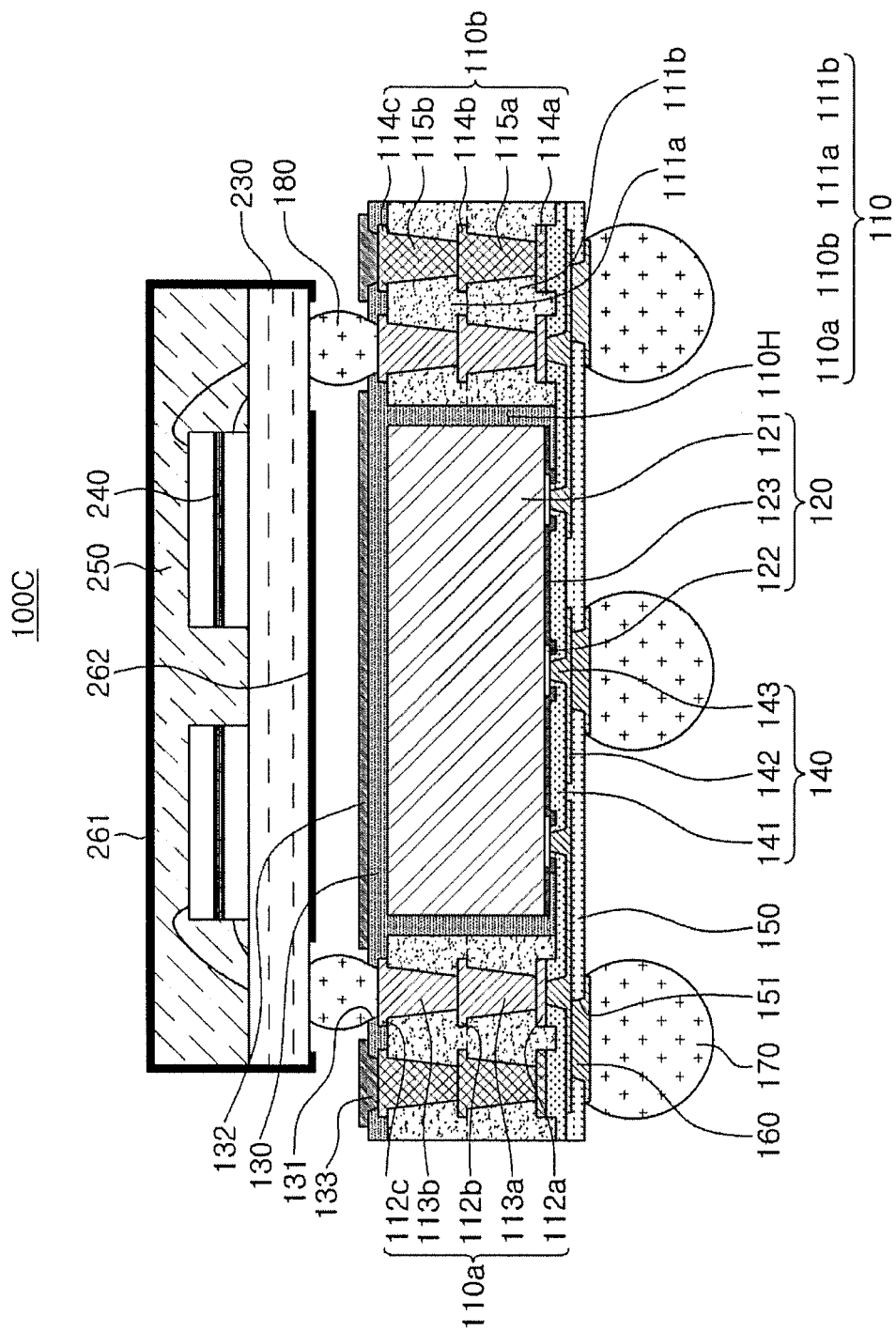
FIG. 14 is a schematic cross-sectional view of another modified example fan-out semiconductor package of FIG. 9.

FIG. 14 is a schematic cross-sectional view of another example fan-out semiconductor package 100C.

Referring to FIG. 14, the fan-out semiconductor package 100C may have another package-on-package (POP) type structure. The fan-out semiconductor package 100C may be similar in some respects to the fan-out semiconductor packages 100A and 100B in FIGS. 9-13, and therefore may be best understood with reference thereto where like numerals designate like components not described again in detail. In the fan-out semiconductor package 100C, the interposer substrate 210 of fan-out semiconductor package 100B of FIG. 13 may be absent and the memory package may be disposed directly on the encapsulant 130, and may be electrically connected to the signal vias 113a and 113b, and the like, through the connection terminals 180. An additional wiring design required due to omission of the interposer substrate may be solved by forming, for example, a backside redistribution layer, or the like, on the encapsulant 130. The memory package may include a wiring substrate 230, a memory 240 disposed on the wiring substrate 230 and electrically connected to the wiring substrate 230 by wire bonding, or the like, and an encapsulant 250 disposed on the wiring substrate 230 and encapsulating the memory 240. A metal layer 261 surrounding the encapsulant 250 may be formed in order to block EMI of the memory package. A metal layer 262 may be formed in a region except for a region in which the connection terminals 180 are disposed, on a lower surface of the wiring substrate 230.

Figure 15:
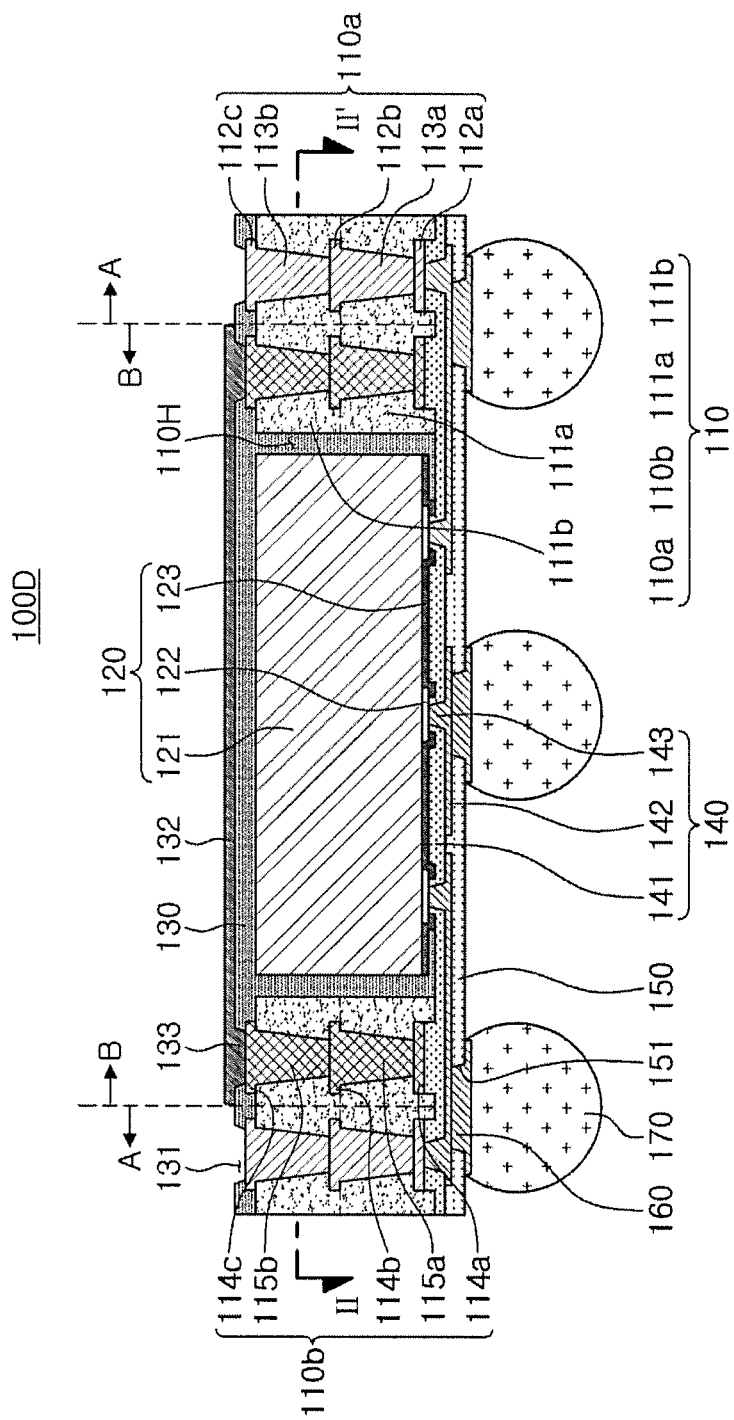
FIG. 15 is a schematic cross-sectional view of another example fan-out semiconductor package.

FIG. 15 is a schematic cross-sectional view of another example fan-out semiconductor package 100D.

Figure 16:
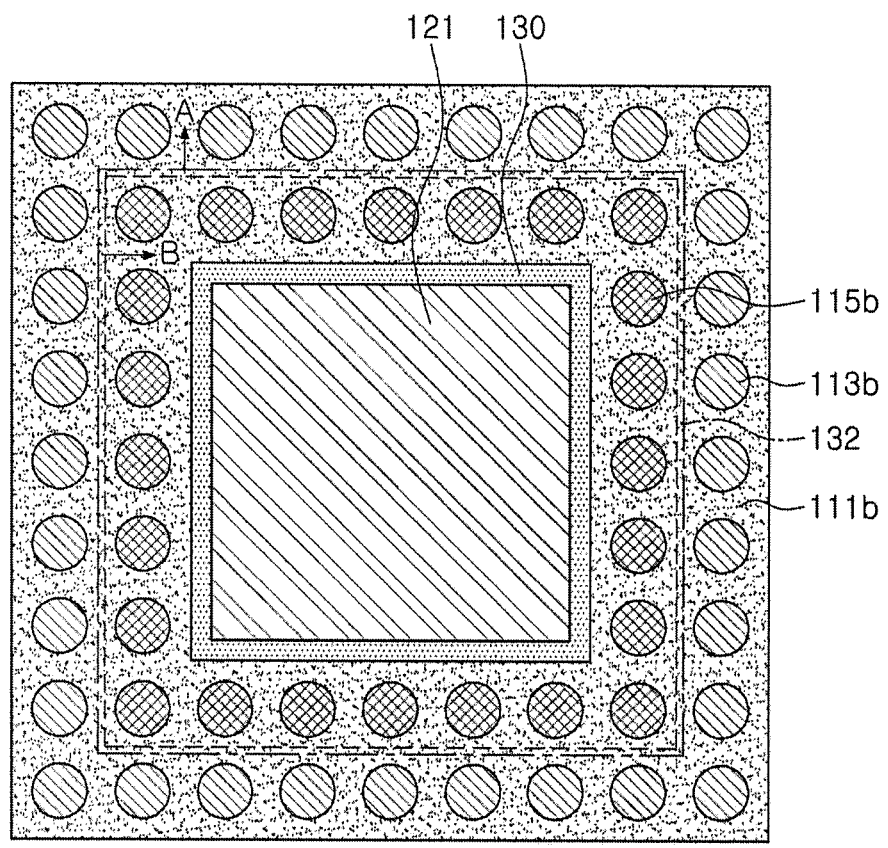
FIG. 16 is a schematic plan view of the fan-out semiconductor package of FIG. 15 taken along line II-II'.

FIG. 16 is a schematic plan view of the fan-out semiconductor package 100D taken along line II-II' of FIG. 15.

Figure 17:
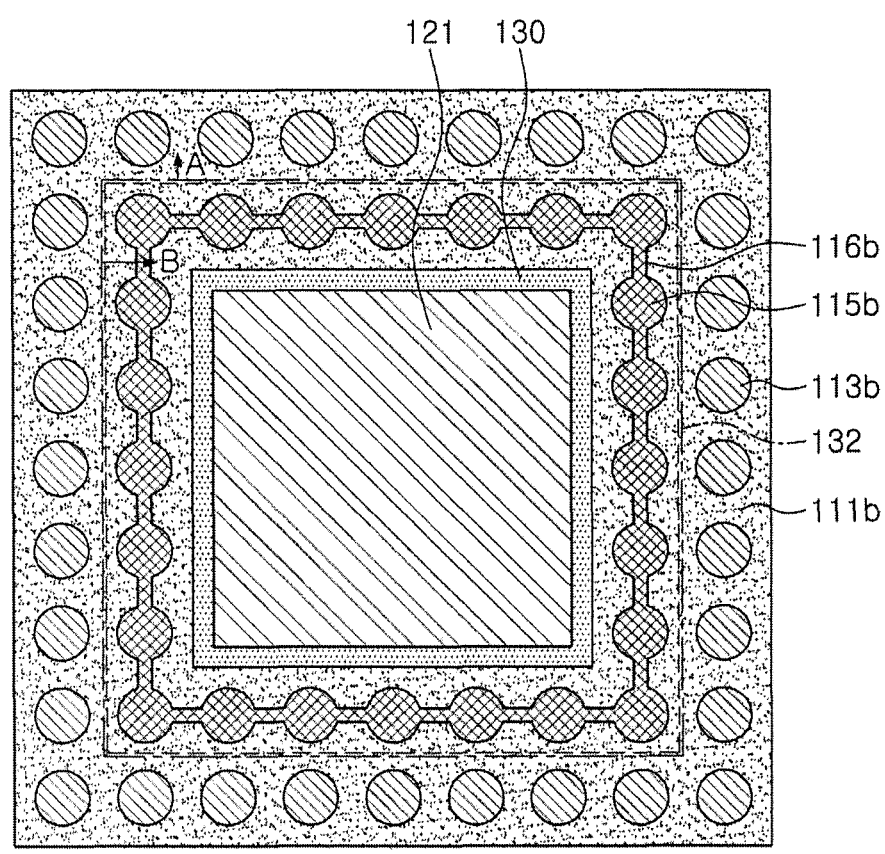
FIG. 17 is another schematic plan view of the fan-out semiconductor package of FIG. 15 taken along line II-II'.

FIG. 17 is another schematic plan view of the fan-out semiconductor package 100D taken along line II-II' of FIG. 15.

Figure 18:
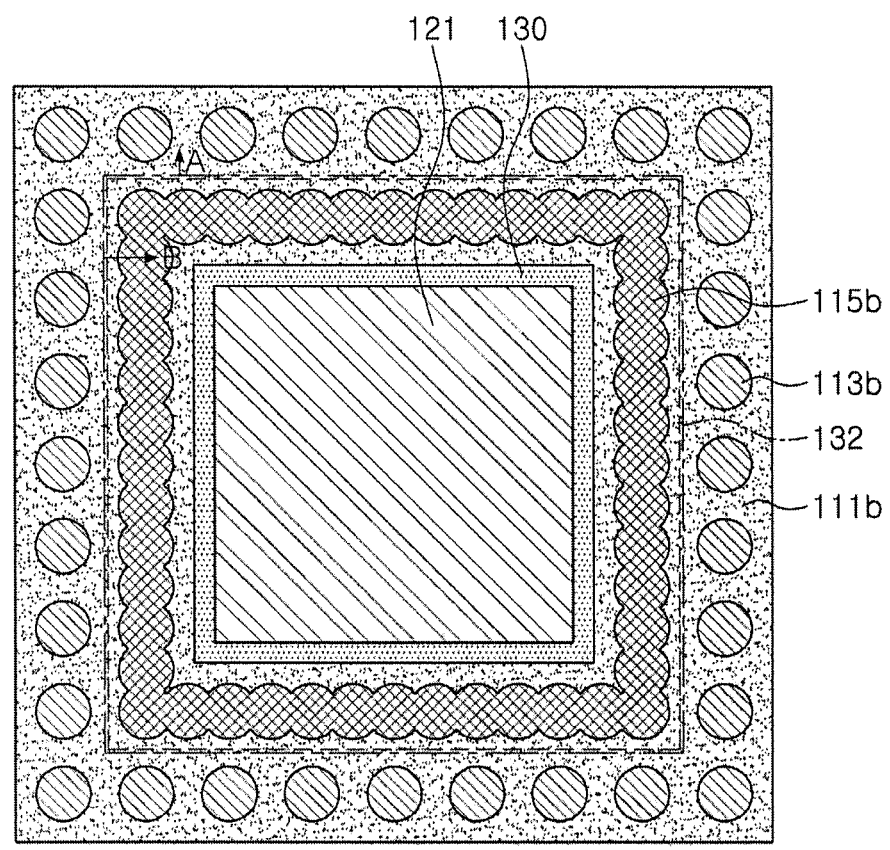
FIG. 18 is still another schematic plan view of the fan-out semiconductor package of FIG. 15 taken along line II-II'.

FIG. 18 is another schematic plan view of the fan-out semiconductor package 100D taken along line II-II' of FIG. 15.

The fan-out semiconductor package 100D may be similar in some respects to the fan-out semiconductor packages 100A, 100B, and 100C in FIGS. 9-14, and therefore may be best understood with reference thereto where like numerals designate like components not described again in detail. Referring to FIGS. 15-18, in the fan-out semiconductor package 100D according to another exemplary embodiment in the present disclosure, a plurality of dummy vias 115a and 115b may be disposed along an inner edge of a first connection member 110 and may be surrounded by a plurality of signal vias 113a and 113b. For example, a dummy part 110b including the plurality of dummy vias 115a and 115b may be disposed in an inner portion B (indicated by the arrows) of the first connection member 110, and a signal part 110a including the plurality of signal vias 113a and 113b may be disposed on an outer portion A (indicated by the arrows) of the first connection member 110. In this case, even though a metal layer 132 is formed up to only the inner portion B of the first connection member 110, the metal layer 132 may be connected to the plurality of dummy vias 115a and 115b through vias 133. In addition, the plurality of dummy vias 115a and 115b may be placed relatively closer to the semiconductor chip 120 in order improve blocking of EMI generated in the semiconductor ship 120 and improve heat dissipation. Also, when the plurality of dummy vias 115a and 115b are disposed on the inner portion A, the respective dummy vias 115a and 115b may be spaced apart from each other or may be connected to each other by line vias 116b In addition, the respective dummy vias 115a and 115b may overlap each other. Contents of the fan-out semiconductor packages 100B and 100C may also be applied to the fan-out semiconductor package 100D according to another exemplary embodiment.

Figure 19:
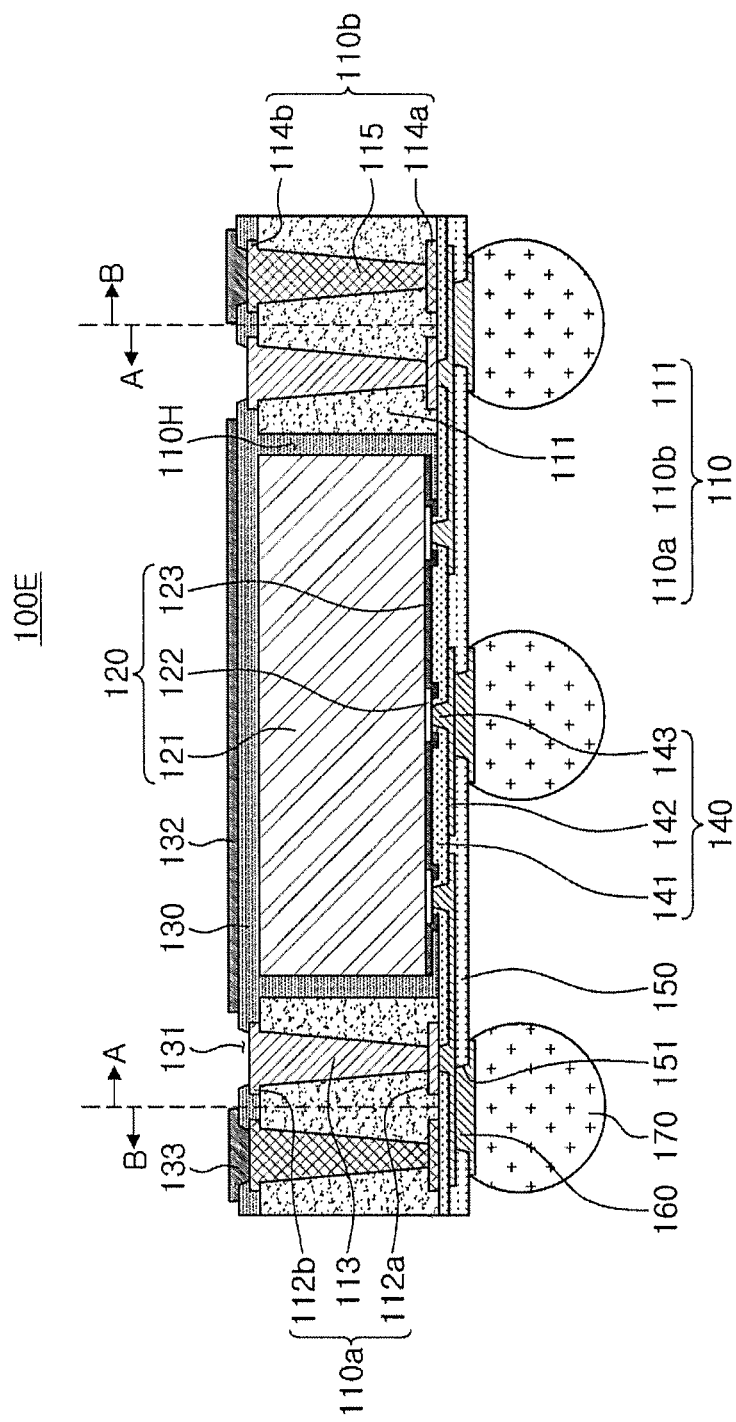
FIG. 19 is a schematic cross-sectional view of another example fan-out semiconductor package.

FIG. 19 is a schematic cross-sectional view of another example fan-out semiconductor package 100E.

The fan-out semiconductor package 100E may be similar in some respects to the fan-out semiconductor packages 100A, 100B, 100C, and 100D in FIGS. 9-18, and therefore may be best understood with reference thereto where like numerals designate like components not described again in detail. Referring to FIG. 19, in the fan-out semiconductor package 100E, a first connection member 110 may include only a single insulating layer 111. Therefore, each of a plurality of signal vias 113 and a plurality of dummy vias 115 may also be formed of a single layer penetrating through only the insulating layer 111. Also in this case, a signal part 110a including the plurality of signal vias 113 may be disposed on an inner portion A of the first connection member 110, and a dummy part 110b including the plurality of dummy vias 115 may be disposed on an outer portion B of the first connection member 110 along an outer edge of the first connection member 110. Although the plurality of dummy vias 115 formed of the single layer as described above, EMI blocking effect and heat dissipation may be obtained.

Figure 20:
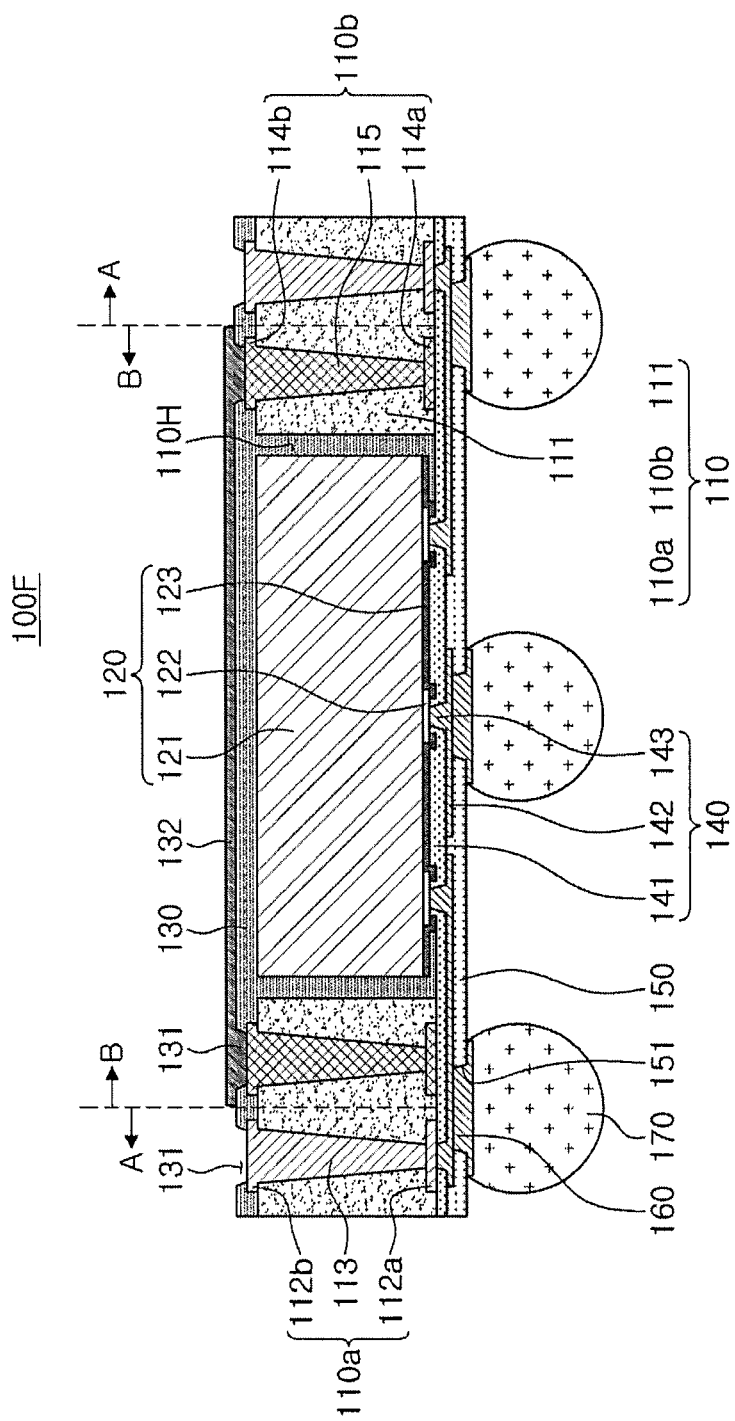
FIG. 20 is a schematic cross-sectional view of still another example fan-out semiconductor package.

FIG. 20 is a schematic cross-sectional view of another example fan-out semiconductor package 100F.

The fan-out semiconductor package 100F may be similar in some respects to the fan-out semiconductor packages 100A, 100B, 100C, 100D, and 100E in FIGS. 9-19, and therefore may be best understood with reference thereto where like numerals designate like components not described again in detail. Referring to FIG. 20, in a fan-out semiconductor package 100F, a first connection member 110 may include only a single insulating layer 111. Therefore, each of a plurality of vias 113 and a plurality of dummy vias 115 may also be formed of a single layer penetrating through only the insulating layer 111. Also in this case, a signal part 110a including the plurality of signal vias 113 may be disposed on an outer portion A of the first connection member 110, and a dummy part 110b including the plurality of dummy vias 115 may be disposed on an inner portion B of the first connection member 110 along an inner edge of the first connection member 110. Although the plurality of dummy vias 115 are formed of the single layer as described above, an improved EMI blocking and heat dissipation may be obtained.

Figure 21:
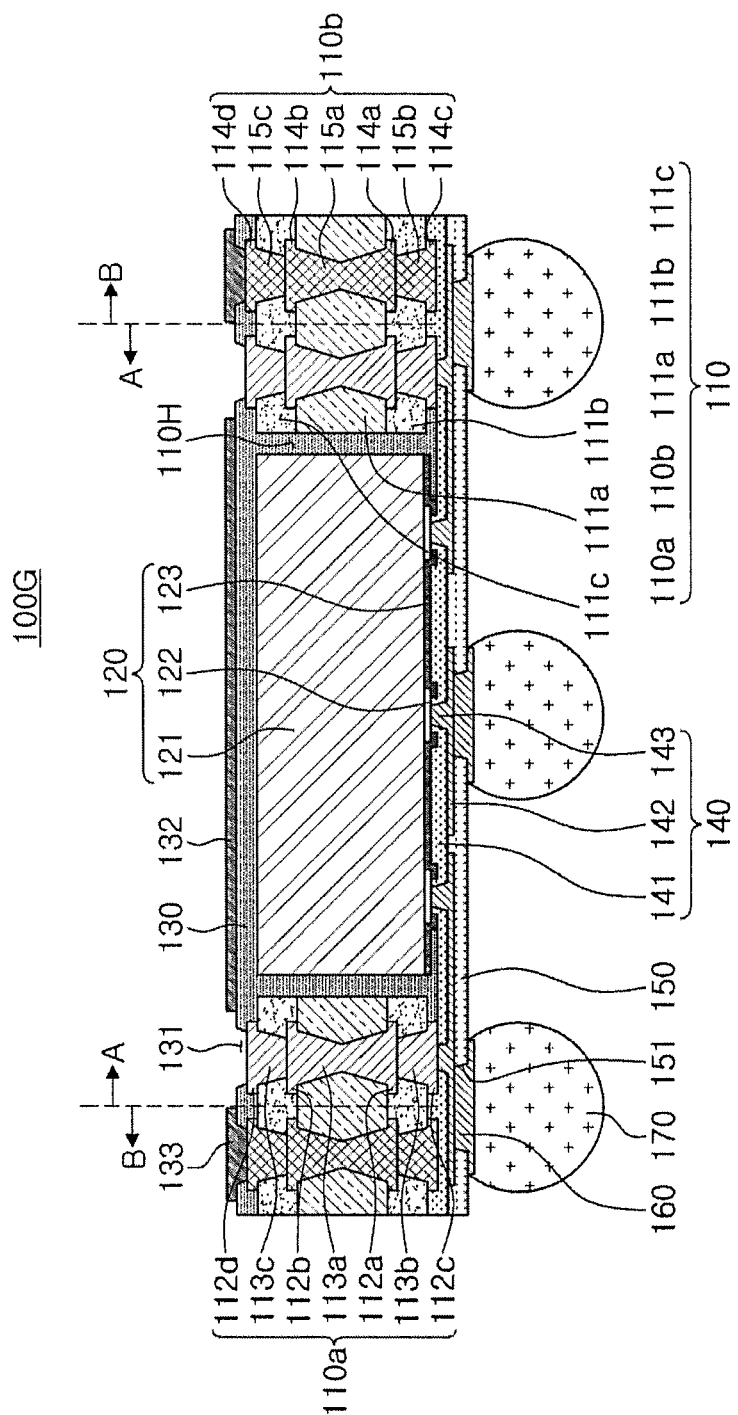
FIG. 21 is a schematic cross-sectional view of yet another example fan-out semiconductor package.

FIG. 21 is a schematic cross-sectional view of another example fan-out semiconductor package 100G.

The fan-out semiconductor package 100G may be similar in some respects to the fan-out semiconductor packages 100A, 100B, 100C, 100D, 100E, and 100F in FIGS. 9-20, and therefore may be best understood with reference thereto where like numerals designate like components not described again in detail. Referring to FIG. 21, in the fan-out semiconductor package 100G, a first connection member 110 may include a first insulating layer 111a, a second insulating layer 111b, a third insulating layer 111c, a signal part 110a, and a dummy part 110b. First redistribution layers 112a and 114a and second redistribution layers 112b and 114b may be disposed on opposite surfaces of the first insulating layer 111a, respectively. The second insulating layer 111b may be disposed on the first insulating layer 112a, and may cover the first redistribution layers 112a and 114a. The third insulating layer 111c may be disposed on the first insulating layer 111a, and may cover the second redistribution layers 112b and 114b. Fourth redistribution layers 112d and 114d may be disposed on the third insulating layer 111c. The first to fourth redistribution layers 112a, 112b, 112c, 112d, 114a, 114b, 114c, and 114d may be electrically connected to connection pads 122. Since the first connection member 110 includes an increased number of redistribution layers 112a, 112b, 112c, 112d, 114a, 114b, 114c, and 114d, a structure of a second connection member 140 may be simplified, and a decrease in a yield due to defects occurring during manufacture of the second connection member 140 may be minimized. The first to fourth redistribution layers 112a, 112b, 112c, 112d, 114a, 114b, 114c, and 114d may be electrically connected to each other by first to third signal vias 113a, 113b, and 113c and first to third dummy vias 115a, 115b, and 115c each penetrating through the first to third insulating layers 111a, 111b, and 111c.

The first insulating layer 111a may have a thickness greater than thicknesses of the second insulating layer 111b and the third insulating layer 111c. The first insulating layer 111a may be relatively thicker to maintain rigidity, and the second insulating layer 111b and the third insulating layer 111c may be provided in order to form increased number of redistribution layers 112c, 112d, 114c, and 114d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. Similarly, a diameter of the first signal via 113a may be greater than those of the second signal via 113b and the third signal via 113c, and a diameter of the first dummy via 115a may be greater than those of the second dummy via 115b and the third dummy via 115c.

A lower surface of the third redistribution layers 112c and 114c of the first connection member 110 may be disposed on a level below a lower surface of the connection pad 122 of a semiconductor chip 120. In addition, a distance between a redistribution layer 142 of the second connection member 140 and the third redistribution layers 112c and 114c of the first connection member 110 may be smaller than that between the redistribution layer 142 of the second connection member 140 and the connection pad 122 of the semiconductor chip 120. Here, the third redistribution layers 112c and 114c may be disposed protruding from the second insulating layer 111b and contacting the second connection member 140. The first redistribution layers 112a and 114a and the second redistribution layers 112b and 114b of the first connection member 110 may be disposed on a level between an active surface and an inactive surface of the semiconductor chip 120. The first connection member 110 may be formed at a thickness corresponding to that of the semiconductor chip 120. Therefore, the first redistribution layers 112a and 114a and the second redistribution layers 112b and 114b formed in the first connection member 110 may be disposed on a level between the active surface and the inactive surface of the semiconductor chip 120.

Thicknesses of the redistribution layers 112a, 112b, 112c, 112d, 114a, 114b, 114c, 114d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, 112d, 114a, 114b, 114c, 114d may also have relatively larger sizes. On the other hand, the redistribution layers 142 of the second connection member 140 may be formed at a relatively smaller thickness. Also in this case, a signal part 110a including the plurality of signal vias 113a, 113b, and 113c may be disposed on an inner portion A of the first connection member 110, and a dummy part 110b including the plurality of dummy vias 115a, 115b, and 115c may be disposed on an outer portion B of the first connection member 110 along a periphery of the first connection member 110. Therefore, an improved EMI blocking and heat dissipation may be obtained.

Figure 22:
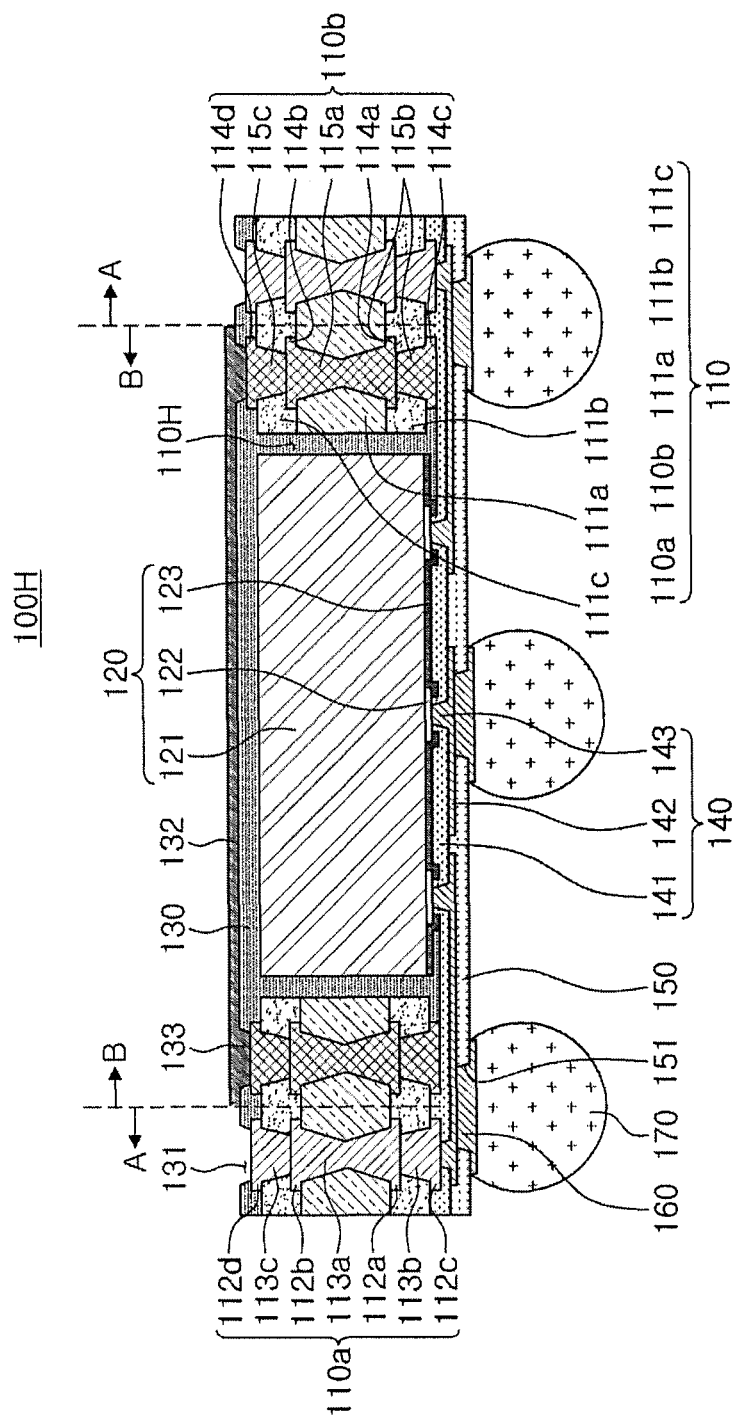
FIG. 22 is a schematic cross-sectional view another example fan-out semiconductor package.

FIG. 22 is a schematic cross-sectional view of another example fan-out semiconductor package 100H.

The fan-out semiconductor package 100H may be similar in some respects to the fan-out semiconductor packages 100A, 100B, 100C, 100D, 100E, 100F, and 100G in FIGS. 9-21, and therefore may be best understood with reference thereto where like numerals designate like components not described again in detail. Referring to FIG. 22, in the fan-out semiconductor package 100H, a first connection member 110 may include a first insulating layer 111a, a second insulating layer 111b, a third insulating layer 111c, a signal part 110a, and a dummy part 110b. First redistribution layers 112a and 114a and second redistribution layers 112b and 114b may be disposed on opposite surfaces of the first insulating layer 111a, respectively. The second insulating layer 111b may be disposed on the first insulating layer 112a, and may cover the first redistribution layers 112a and 114a. The third insulating layer 111c may be disposed on the first insulating layer 111a, and may cover the second redistribution layers 112b and 114b. Fourth redistribution layers 112d and 114d may be disposed on the third insulating layer 111c. The first to fourth redistribution layers 112a, 112b, 112c, 112d, 114a, 114b, 114c, and 114d may be electrically connected to connection pads 122. The first to fourth redistribution layers 112a, 112b, 112c, 112d, 114a, 114b, 114c, and 114d may be electrically connected to each other by first to third signal vias 113a, 113b, and 113c and first to third dummy vias 115a, 115b, and 115c respectively penetrating through the first to third insulating layers 111a, 111b, and 111c.

Also, a signal part 110a including the plurality of signal vias 113a, 113b, and 113c may be disposed on an outer portion A of the first connection member 110, and a dummy part 110b including the plurality of dummy vias 115a, 115b, and 115c may be disposed on an inner portion B of the first connection member 110 along an inner edge of the first connection member 110. Therefore, an improved EMI blocking and heat dissipation may be obtained.

As set forth above, according to the exemplary embodiments in the present disclosure, a fan-out semiconductor package having improved EMI blocking and the heat dissipation is provided.

While exemplary embodiments have been shown and described above, it will be apparent to those skilled in the art that modifications and variations could be made without departing from the scope of the present invention as defined by the appended claims.

What is claimed is:

1. A fan-out semiconductor package, comprising:
a first connection member having a through-hole;
a semiconductor chip disposed in the through-hole of the first connection member and having an active surface with connection pads disposed thereon and an inactive surface opposite the active surface;
an encapsulant encapsulating at least a portion of the first connection member and the inactive surface of the semiconductor chip; and
a second connection member disposed on the first connection member and the active surface of the semiconductor chip, wherein
the first connection member and the second connection member include, respectively, redistribution layers electrically connected to the connection pads of the semiconductor chip,
the redistribution layer of the first connection member includes a signal pattern and a ground pattern, and
the first connection member includes a plurality of dummy vias connected to the ground pattern and surrounding the semiconductor chip.

2. The fan-out semiconductor package of claim 1, further comprising a metal layer disposed on the encapsulant and covering at least a portion of the inactive surface of the semiconductor chip,
wherein the metal layer is connected to the plurality of dummy vias.

3. The fan-out semiconductor package of claim 1, wherein the first connection member includes a plurality of signal vias connected to the signal pattern.

4. The fan-out semiconductor package of claim 3, wherein the plurality of dummy vias are disposed along an outer edge of the first connection member and surround the plurality of signal vias.

5. The fan-out semiconductor package of claim 3, wherein the plurality of dummy vias are disposed along an inner edge of the first connection member and are surrounded by the plurality of signal vias.

6. The fan-out semiconductor package of claim 1, wherein the plurality of dummy vias are spaced apart from each other by a predetermined interval.

7. The fan-out semiconductor package of claim 6, wherein the plurality of dummy vias are connected to each other by a plurality of line vias.

8. The fan-out semiconductor package of claim 1, wherein the plurality of dummy vias overlap each other.

9. The fan-out semiconductor package of claim 3, further comprising a memory package disposed on the encapsulant and electrically connected to the plurality of signal vias.

10. The fan-out semiconductor package of claim 1, wherein the first connection member includes a first insulating layer, a first redistribution layer in contact with the second connection member and embedded in the first insulating layer, and a second redistribution layer disposed on a surface of the first insulating layer opposite a surface of the first insulating layer having the first redistribution layer embedded therein, and
the plurality of dummy vias include first dummy vias penetrating through the first insulating layer.

11. The fan-out semiconductor package of claim 10, wherein the first connection member further includes a second insulating layer disposed on the first insulating layer and covering the second redistribution layer and a third redistribution layer disposed on the second insulating layer, and the plurality of dummy vias further include second dummy vias penetrating through the second insulating layer.

12. The fan-out semiconductor package of claim 10, wherein a distance between the redistribution layer of the second connection member and the first redistribution layer is greater than a distance between the redistribution layer of the second connection member and the connection pad of the semiconductor chip.

13. The fan-out semiconductor package of claim 1, wherein the first connection member includes a first insulating layer, a first redistribution layer and a second redistribution layer disposed on opposite surfaces of the first insulating layer, a second insulating layer disposed on the first insulating layer and covering the first redistribution layer, and a third redistribution layer disposed on the second insulating layer, and
the plurality of dummy vias include first and second dummy vias respectively penetrating through the first and second insulating layers.

14. The fan-out semiconductor package of claim 13, wherein the first connection member further includes a third insulating layer disposed on the first insulating layer and covering the second redistribution layer and a fourth redistribution layer disposed on the third insulating layer, and
the plurality of dummy vias include first, second, and third dummy vias respectively penetrating through the first, second, and third insulating layers.

15. The fan-out semiconductor package of claim 13, wherein a thickness of the first insulating layer is greater than a thickness of the second insulating layer.

16. A fan-out semiconductor package, comprising:
a first connection member having a through-hole;
a semiconductor chip disposed in the through-hole of the first connection member and having an active surface with connection pads disposed thereon and an inactive surface opposite the active surface; and
a second connection member disposed on the first connection member and the active surface of the semiconductor chip and including a redistribution layer electrically connected to the connection pads of the semiconductor chip, wherein
the first connection member includes a plurality of signal vias and a plurality of dummy vias, and
the plurality of dummy vias surround the plurality of signal vias or are surrounded by the plurality of signal vias.

17. A fan-out semiconductor package, comprising:
a first connection member having a through-hole;
a semiconductor chip disposed in the through-hole of the first connection member and having an active surface with connection pads disposed thereon and an inactive surface opposite the active surface;
an encapsulant encapsulating at least a portion of the first connection member and the inactive surface of the semiconductor chip; and
a second connection member disposed on the first connection member and the active surface of the semiconductor chip, wherein
the first connection member and the second connection member include, respectively, redistribution layers electrically connected to the connection pads of the semiconductor chip,
the redistribution layer of the first connection member includes a signal pattern and a ground pattern,
the first connection member includes a plurality of signal vias and a plurality of dummy vias, the plurality of dummy vias being connected to the ground pattern and surrounding the semiconductor chip, and the plurality of dummy vias and the plurality of signal vias are radially offset from each other.

18. The fan-out semiconductor package of claim 17, wherein the first connection member includes a first insulating layer, a first redistribution layer and a second redistribution layer disposed on opposite surfaces of the first insulating layer, a second insulating layer disposed on the first insulating layer and covering the first redistribution layer, and a third redistribution layer disposed on the second insulating layer, and the plurality of dummy vias include first and second dummy vias respectively penetrating through the first and second insulating layers.

19. The fan-out semiconductor package of claim 17, wherein the first connection member includes:

a first insulating layer, a first redistribution layer and a second redistribution layer disposed on opposite surfaces of the first insulating layer, a second insulating layer disposed on the first insulating layer and covering the first redistribution layer, a third redistribution layer disposed on the second insulating layer, a third insulating layer disposed on the first insulating layer and covering the second redistribution layer, and a fourth redistribution layer disposed on the third insulating layer, wherein the plurality of dummy vias include first, second, and third dummy vias respectively penetrating through the first, second, and third insulating layers.

20. The fan-out semiconductor package of claim 17, wherein the first connection member includes a first insulating layer, a second insulating layer disposed on the first insulating layer, and the plurality of dummy vias include first and second dummy vias respectively penetrating through the first insulating layer and the second insulating layer.

* * * * *